(12) United States Patent
George

(10) Patent No.: US 10,804,383 B2
(45) Date of Patent: Oct. 13, 2020

(54) SINGLE ELECTRON TRANSISTORS HAVING SOURCE/DRAIN ELECTRODE INSULATING SUPPORTS AND AN ISLAND EXTENDING THEREBETWEEN

(71) Applicant: Intel Corporation, Santa Clara, CA (US)

(72) Inventor: Hubert C. George, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/318,527

(22) PCT Filed: Sep. 24, 2016

(86) PCT No.: PCT/US2016/053606
§ 371 (c)(1),
(2) Date: Jan. 17, 2019

(87) PCT Pub. No.: WO2018/057015
PCT Pub. Date: Mar. 29, 2018

(65) Prior Publication Data
US 2019/0245071 A1    Aug. 8, 2019

(51) Int. Cl.
*H01L 29/76* (2006.01)
*H01L 29/66* (2006.01)
(Continued)

(52) U.S. Cl.
CPC .......... *H01L 29/7613* (2013.01); *B82Y 40/00* (2013.01); *G06N 10/00* (2019.01);
(Continued)

(58) Field of Classification Search
CPC ............. H01L 29/7613; H01L 29/7888; H01L 29/41725; H01L 27/085; H01L 29/42312; H01L 29/0653; H01L 29/66439
See application file for complete search history.

(56) References Cited

U.S. PATENT DOCUMENTS

2004/0075123 A1    4/2004  Fraboulet et al.
2004/0238812 A1*   12/2004 Wasshuber ............. B82Y 10/00
                                                              257/14
(Continued)

FOREIGN PATENT DOCUMENTS

JP          590567        4/1993
WO    2015119947 A2       8/2015
WO    2018057015 A1       3/2018

OTHER PUBLICATIONS

Braakman et al., "Photon- and Phonon-Assisted Tunneling in the Three-Dimensional Charge Stability Diagram of a Triple Quantum Dot Array," Applied Physics Letters 102; pp. 112110-1 through 112110-4 (5 pages with cover sheet) (2013).
(Continued)

*Primary Examiner* — Ermias T Woldegeorgis
(74) *Attorney, Agent, or Firm* — Patent Capital Group

(57) ABSTRACT

Disclosed herein are single electron transistor (SET) devices, and related methods and devices. In some embodiments, a SET device may include: first and second source/drain (S/D) electrodes disposed on a side face of a first insulating support and on a side face of a second insulating support, respectively; an island disposed between the first and second S/D electrodes and extending into an area between the first and second insulating supports. In some embodiments, a SET device may include: first and second S/D electrodes disposed on a substrate; an island disposed in an area between the first and second S/D electrodes; first and second portions of dielectric disposed between the island and the first and second S/D electrodes, respectively; and a third portion of dielectric disposed between the substrate and the island.

20 Claims, 33 Drawing Sheets

(51) Int. Cl.
| | |
|---|---|
| H01L 29/06 | (2006.01) |
| H01L 29/423 | (2006.01) |
| B82Y 40/00 | (2011.01) |
| H01L 29/12 | (2006.01) |
| G06N 10/00 | (2019.01) |
| H01L 27/085 | (2006.01) |
| H01L 29/417 | (2006.01) |
| B82Y 10/00 | (2011.01) |
| H01L 21/02 | (2006.01) |
| H01L 21/285 | (2006.01) |
| H01L 21/3105 | (2006.01) |

(52) U.S. Cl.
CPC ........ *H01L 27/085* (2013.01); *H01L 29/0649* (2013.01); *H01L 29/0653* (2013.01); *H01L 29/0665* (2013.01); *H01L 29/127* (2013.01); *H01L 29/41725* (2013.01); *H01L 29/423* (2013.01); *H01L 29/42312* (2013.01); *H01L 29/42356* (2013.01); *H01L 29/66439* (2013.01); *B82Y 10/00* (2013.01); *H01L 21/0228* (2013.01); *H01L 21/28556* (2013.01); *H01L 21/31053* (2013.01)

(56) References Cited

U.S. PATENT DOCUMENTS

| | | | |
|---|---|---|---|
| 2008/0246021 A1 | 10/2008 | Suk et al. | |
| 2010/0019227 A1* | 1/2010 | Wasshuber | B82Y 10/00 257/24 |
| 2010/0118915 A1* | 5/2010 | Simon | G06F 1/20 374/176 |
| 2010/0330751 A1 | 12/2010 | Choi et al. | |
| 2013/0264617 A1 | 10/2013 | Joshi et al. | |

OTHER PUBLICATIONS

Dubuc et al., "Single-Electron Transistors With Wide Operating Temperature Range," Applied Physics Letters 90; 113104-1 through 113104-3 (2007).
Dubuc, et al., "A Nanodamascene Process for Advanced Single-Electron Transistor Fabrication," IEEE Transactions on Nanotechnology; vol. 7, No. 1; pp. 68-73 (Jan. 2008).
Geroge et al., "Platinum Single-Electron Transistors With Tunnel Barriers Made by Atomic Layer Deposition," J. Vac. Sci. Technol. B 28(6); 3 pages (Nov./Dec. 2010).
House et al., "Radio Frequency Measurements of Tunnel Couplings and Singlet-Triplet Spin States in Si:P Quantum Dots," Nature Communications, 6:8848, DOI: 10.1038/ncomms9848; pp. 1-6 (published Nov. 8, 2015).
Jung et al., "Fabrication and Characterization of Sidewall Defined Silicon-on-Insulator Single-Electron Transistor," IEEE Transactions on Nanotechnology; vol. 7, No. 5, pp. 544-550 (Sep. 2008).
Kim et al., "Investigation of Vertical Type Single-Electron Transistor with Sidewall Spacer Quantum Dot," Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
Park et al., "Single-Electron Transistors Fabricated With Sidewall Spacer Patterning," Superlattices and Microstructures 34; pp. 231-239 (2003).
Veldhorst et al., "A Two-Qubit Logic Gate in Silicon," Nature; vol. 526; pp. 410-414 (Oct. 15, 2015).
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.

"Independent, extensible control of same-frequency superconducting qubits by selective broadcasting," Asaad et al., Netherlands Organisation for Applied Scientific Research, Aug. 28, 2015, 17 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Surface loss simulations of superconducting coplanar waveguide resonators," Wenner et al, Applied Physics Letters 99, 113513 (2011), pp. 113513-1 through 113513-3.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.
"Magnetic field tuning of coplanar waveguide resonators," Healey, et al., Applied Physics Letters 93, 043513 (2008), pp. 043513-1 through 043513-3 (4 pages with cover sheet).
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al, Netherlands Organisation for Applied Scientific Research, Dec. 28, 2016, 9 pages.
"Defect reduction of selective Ge epitaxy in trenches on Si(001) substrates using aspect ratio trapping," Park et al., Applied Physics Letter 90, 052113 (2007), pp. 052113-1 through 052113-3.
"Detecting bit-flip errors in a logical qubit using stabilizer measurements," Riste et al., Nature Communications, 6:6983, DOI: 10.1038/ncomms7983, pp. 1-6.
"Scalable gate architecture for densely packed semiconductor spin qubits," Zajac et al, Department of Physics, Princeton University; Sandia National Laboratories, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.

(56) References Cited

OTHER PUBLICATIONS

"Single-shot read-out of an individual electron spin in a quantum dot," Elzerman et al., Nature, vol. 430, Jul. 22, 2004, pp. 431-435.
"Suspending superconducting qubits by silicon micromachining," Chu et al., Department of Applied Physics, Yale University, Jun. 10, 2016, 10 pages.
"Single-charge tunneling in ambipolar silicon quantum dots," Müller, Filipp, Dissertation, University of Twente, Jun. 19, 2015, 148 pages.
"An addressable quantum dot qubit with fault-tolerant control-fidelity," Veldhorst et al., Nature Nanotechnology vol. 9, Dec. 2014, pp. 981-985.
PCT International Search Report and Written Opinion in PCT/US2016/053606 dated May 31, 2017; 10 pages.
European Extended Search Report issued in European Application No. 16916981.0 dated May 12, 2020; 13 pages.
Gwong-Liang, C., et al., "Room-Temperature Observation of Large Coulomb-Blockade Oscillations from Geranium Quantum-Dot Single-Hole Transistors with Self-Aligned Electrodes," Proceedings of the 7th IEEE; International Conference on Nanotechnology; Aug. 2-5, 2007; Hong Kong; pp. 1313-1316.
Ono, Y., et al., "Manipulation and Detection of Single Electrons for Future Information Processing," Journal of Applied Physics; vol. 97, No. 3; 19 pages (Jan. 19, 2005).
Tan, Y.T., et al., "Room Temperature Nanocrystalline Silicon Single-Electron Transistors," Journal of Applied Physics; vol. 94, No. 1; 5 pages (Jul. 1, 2003).

\* cited by examiner

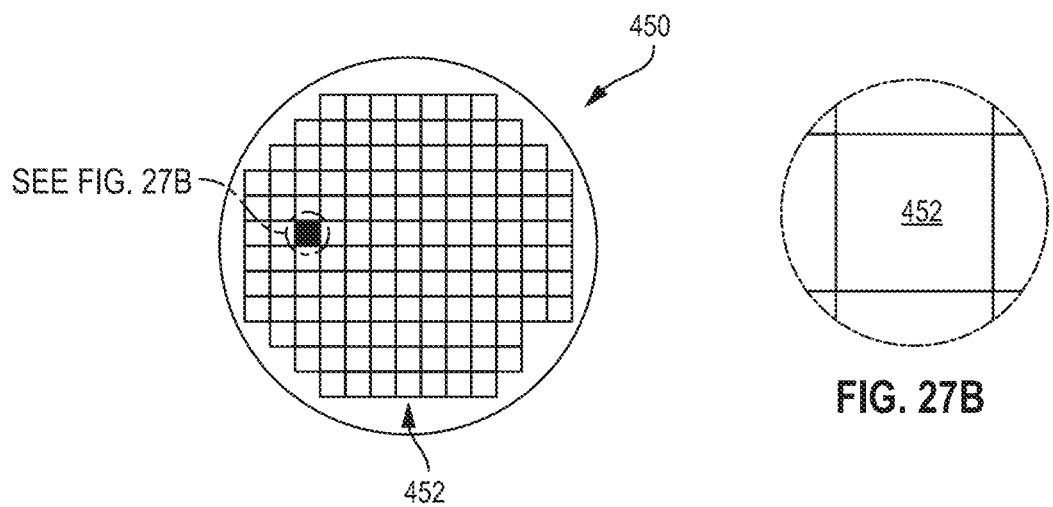
FIG. 27A
FIG. 27B
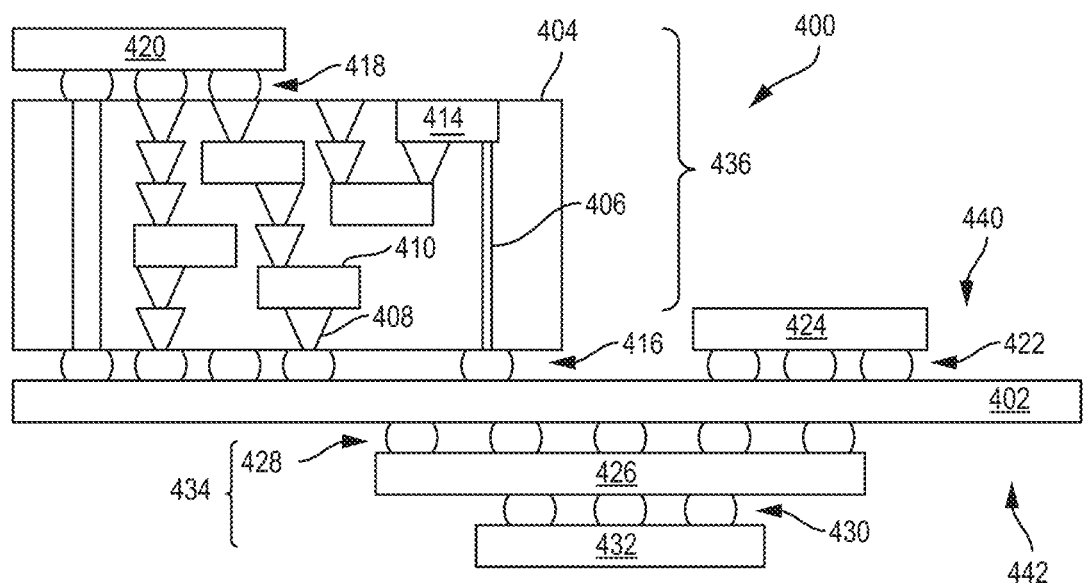
**FIG. 28

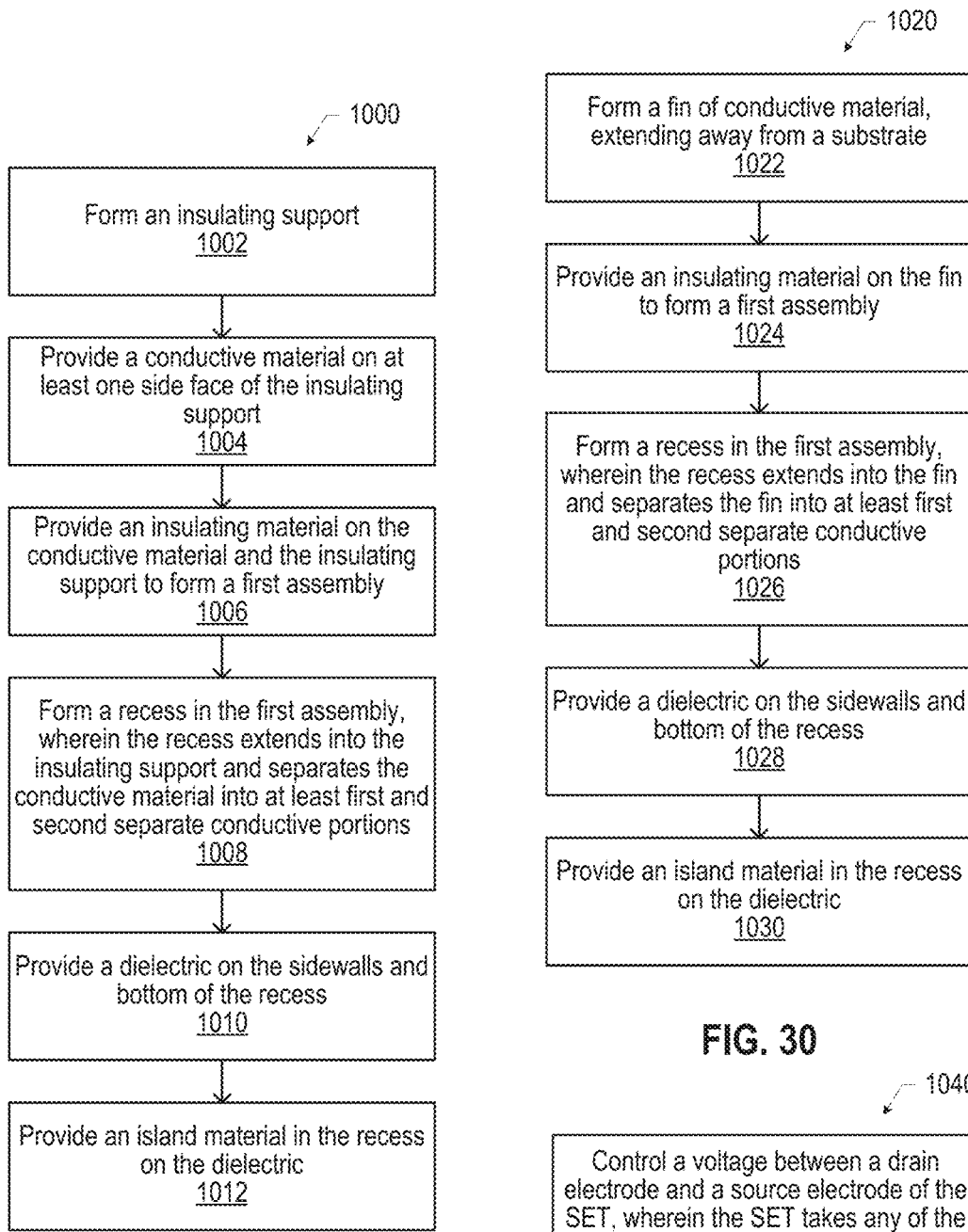
FIG. 29
FIG. 30
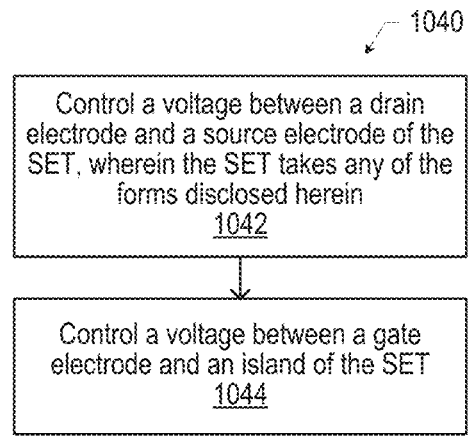
FIG. 31

SINGLE ELECTRON TRANSISTORS HAVING SOURCE/DRAIN ELECTRODE INSULATING SUPPORTS AND AN ISLAND EXTENDING THEREBETWEEN

CROSS-REFERENCE TO RELATED APPLICATION

This application is a national stage application under 35 U.S.C. § 371 of PCT International Application Serial No. PCT/US2016/053606, filed on Sep. 24, 2016 and entitled "SINGLE ELECTRON TRANSISTORS," which is hereby incorporated by reference in its entirety.

BACKGROUND

A single electron transistor (SET) is an electronic device in which carriers flow by tunneling through a pair of tunnel junctions. One conventional approach to SET fabrication is referred to as the Dolan bridge technique; in this technique, a double-layer electron beam resist and a double-angle evaporation are performed to deposit the metals that form the SET.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 27A and 27B are top views of a wafer and dies that may include any of the SET devices disclosed herein.

FIG. 28 is a cross-sectional side view of a device assembly that may include any of the SET devices disclosed herein.

FIG. 29 is a flow diagram of an illustrative method of manufacturing a SET device, in accordance with various embodiments.

FIG. 30 is a flow diagram of another illustrative method of manufacturing a SET device, in accordance with various embodiments.

FIG. 31 is a flow diagram of an illustrative method of operating a SET device, in accordance with various embodiments.

DETAILED DESCRIPTION

Figure 1A:
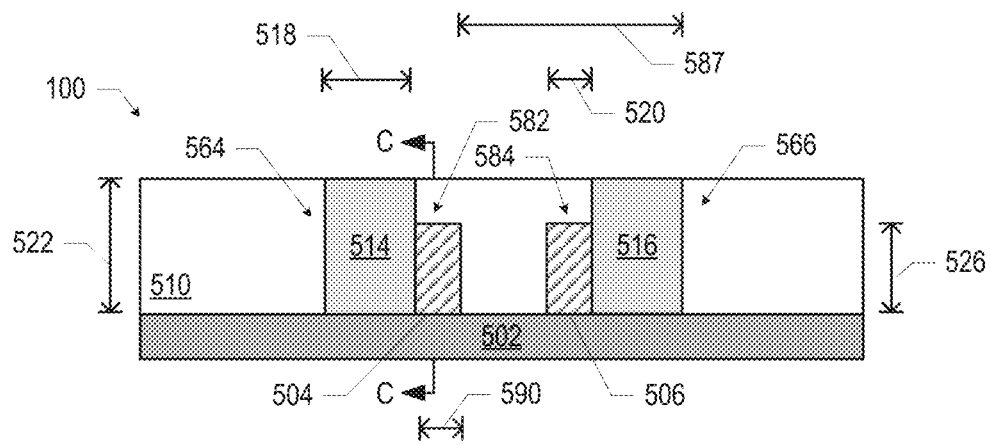
FIGS. 1A-1F are various views of a single electron transistor (SET) device, in accordance with various embodiments.
Figure 1B:
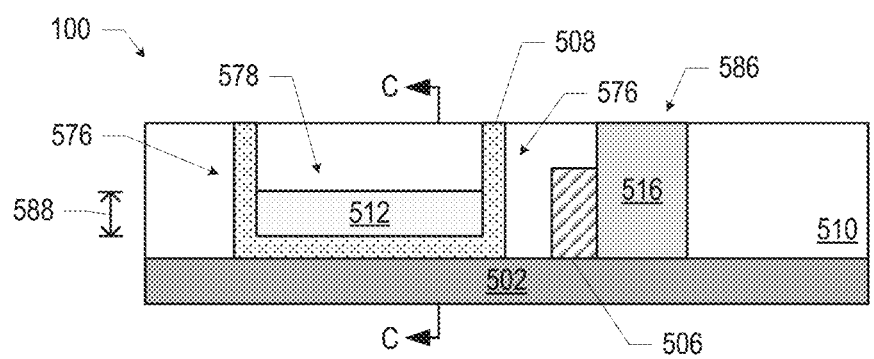
Figure 1C:
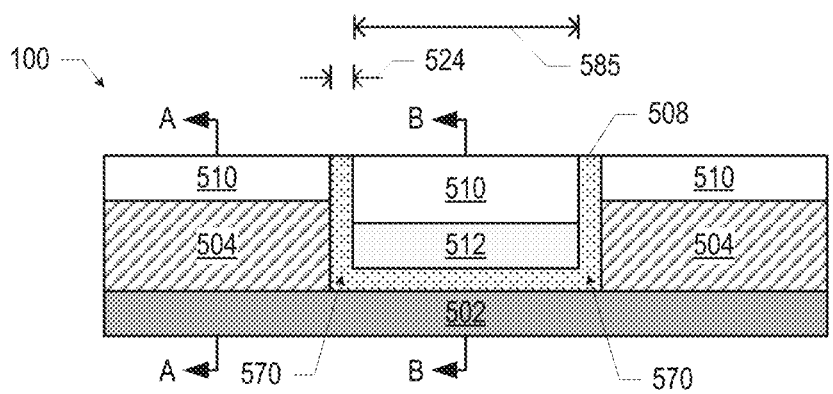
Figure 1D:
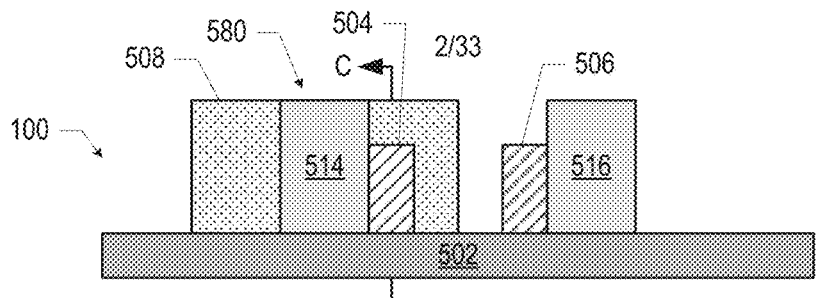
Figure 1E:
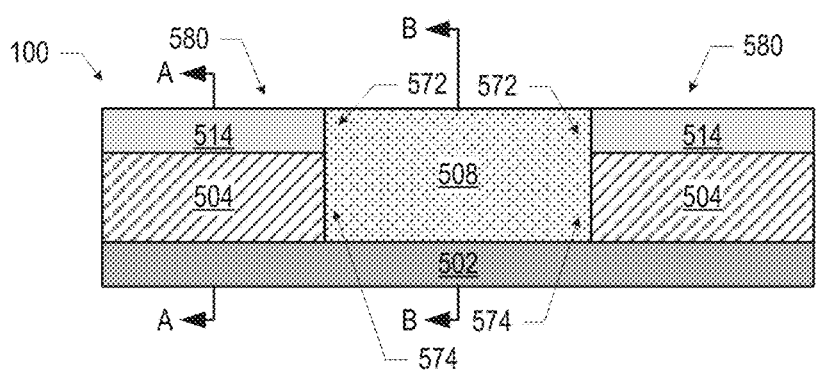

Disclosed herein are single electron transistor (SET) devices, and related methods and devices. In some embodiments, a SET device may include: first and second source/drain (S/D) electrodes disposed on a side face of a first insulating support and on a side face of a second insulating support, respectively; an island disposed between the first and second S/D electrodes and extending into an area between the first and second insulating supports. In some embodiments, a SET device may include: first and second S/D electrodes disposed on a substrate; an island disposed in an area between the first and second S/D electrodes; first and second portions of dielectric disposed between the island and the first and second S/D electrodes, respectively; and a third portion of dielectric disposed between the substrate and the island. Other embodiments are also discussed in detail herein.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The disclosure may use the singular term "layer," but the term "layer" should be understood to refer to assemblies that may include multiple different material layers. The accompanying drawings are not necessarily drawn to scale. For ease of discussion, all of the lettered sub-figures associated with a particular numbered figure may be referred to by the number of that figure; for example, FIGS. 1A-1F may be referred to as "FIG. 1," FIGS. 2A-2C may be referred to as "FIG. 2," etc.

FIG. 1 provides various views of a first embodiment of a SET device 100. In particular, FIG. 1A is a cross-sectional view of the SET device 100 through the section A-A of FIGS. 1C, 1E, and 1F; FIG. 1B is a cross-sectional view of the SET device 100 through the section B-B of FIGS. 1C, 1E, and 1F; FIG. 1C is a cross-sectional view of the SET device 100 through the section C-C of FIGS. 1A, 1B, 1D, and 1F; FIG. 1D is a side view of the SET device 100 toward the section A-A with the insulator 510 removed; FIG. 1E is a side view of the SET device 100 toward the section C-C from the gate electrode 506 with the insulator 510 removed; and FIG. 1F is a top view of the SET device 100 with the insulator 510 removed.

As illustrated in FIG. 1, the SET device 100 may include a source/drain (S/D) structure 581 including two S/D supports 514 disposed on a substrate 502. The S/D structure 581 may also include an S/D electrode 504 disposed on the side faces 562 of the S/D supports 514; in the embodiment of FIG. 1, no electrode may be disposed on the opposite side faces 564 of the S/D supports 514. The two S/D supports 514, and the two S/D electrodes 504, may be spaced apart by intervening dielectric 508 and an island 512. In particular, the SET device 100 may include two tunnel junctions (TJs) 570, each formed by a portion of dielectric 508 "sandwiched" between an S/D electrode 504 and the island 512. The S/D structure 581 may include the S/D supports 514, the dielectric 508, the S/D electrodes 504, and the island 512.

The dielectric 508 may extend up the sidewalls 572 of the S/D supports 514, and up the sidewalls 574 of the S/D electrodes 504. In some embodiments, the dielectric 508 may extend along the substrate 502 between the S/D supports 514 and the S/D electrodes 504 such that a portion of the dielectric 508 is disposed between the island 512 and the substrate 502. The dielectric 508 may also extend up sidewalls 576 of the insulator 510, as shown. In some embodiments, the dielectric 508 may have a substantially uniform thickness 524 between 0.5 and 5 nanometers (e.g., 1 nanometer).

The island 512 may be disposed at the bottom of the "box" formed by the dielectric 508. In some embodiments, the top face 578 of the island 512 may be recessed back from the top faces 580 of the S/D supports 514; in some such embodiments, a portion of the insulator 510 may be disposed in the "box" formed by the dielectric 508 such that the island 512 is disposed between this portion of the insulator 510 and the substrate 502. In some embodiments, the island 512 may have a thickness 588 between 5 and 30 nanometers (e.g., 10 nanometers).

The SET device 100 may also include a gate structure 583. The gate structure 583 may include a support 516 disposed on the substrate 502. The gate structure 583 may also include a gate electrode 506 disposed on a side face 568 of the gate support 516; in the embodiment of FIG. 1, no electrode may be disposed on the opposite side face 566 of the gate support 516. The S/D electrodes 504, the dielectric 508, the island 512, and the gate electrode 506 may together provide a SET.

During use of the SET devices 100 disclosed herein, a voltage may be applied across the S/D electrodes 504 and to the gate electrode 506 to provide a potential for carriers (e.g., electrons) to tunnel through the TJs 570 into and out of the island 512. In particular, the gate electrode 506 may be capacitively coupled to the island 512, and thus the potential of the gate electrode 506 may be used to tune the potential of the island 512. Because carriers (e.g., electrons) enter the island 512 via tunneling, the flow of carriers into the island 512 is a discrete phenomenon, and may be characterized by the number of carriers occupying the island 512 at any given time. The conductance of the island 512 (and thus the conductance of the SET device 100) may change in response to electrical charges proximate to the island 512, and the rate of change of this conductance may be a function of the voltage on the gate electrode 506. Thus, when the SET device 100 is to be used as a charge detector (and thus a large change in conductance is desired when a charge is present), the voltage on the gate electrode 506 may be set to a bias level corresponding to a steep slope of the bias-conductance curve of the SET device 100. In some embodiments, the SET device 100 may be used as a charge detector in a quantum computing setting to detect the state of a proximate qubit (e.g., to detect the spin state of an electron trapped in a proximate quantum well).

In some embodiments, the SET devices 100 disclosed herein may themselves be used as a qubit in a quantum computing device. For example, an electron may be confined in the island 512, and the spin of the electron may be used as a qubit for quantum computations. Thus, any of the SET devices 100 disclosed herein may be used in a computing device to detect the state of spin-based qubits, provide spin-based qubits, or both.

In some embodiments, the top faces 582 of the S/D electrodes 504 may be recessed back from the top faces 580 of the S/D supports 514. Similarly, in some embodiments, the top face 584 of the gate electrode 506 may be recessed back from the top face 586 of the gate support 516. In some embodiments, the gate electrode 506 and the S/D electrodes 504 may have a same height 526. In other embodiments, the gate electrode 506 and the S/D electrodes 504 may have different heights. Generally, the height 526 of the gate electrode 506 and/or the S/D electrodes 504 may be between 5 and 15 nanometers (e.g., 10 nanometers). In some embodiments, the S/D supports 514 and the gate support 516 may have a same height 522. In other embodiments, the S/D supports 514 and the gate support 516 may have different heights. Generally, the height 522 of the gate support 516 and/or the S/D supports 514 may be between 20 and 100 nanometers (e.g., between 30 and 80 nanometers, or approximately equal to 50 nanometers). In some embodiments, the S/D supports 514 and the gate support 516 may have a same width 518. In other embodiments, the S/D supports 514 and the gate support 516 have different widths. Generally, the width 518 of the S/D supports 514 and/or the gate support 516 may be between 20 and 100 nanometers (e.g., 40 nanometers).

Figure 2A:
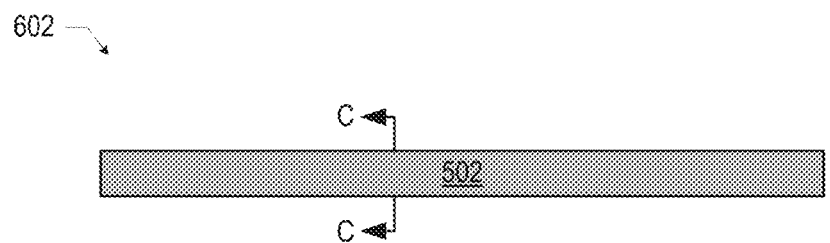
FIGS. 2A-2C, 3A-3C, 4A-4C, 5A-5C, 6A-6C, 7A-7C, 8A-8C, 9A-9C, 10A-10C, 11A-11C, 12A-12C, and 13A-13C illustrate various example stages in the manufacture of the SET device of FIGS. 1A-1F, in accordance with various embodiments.
Figure 2B:
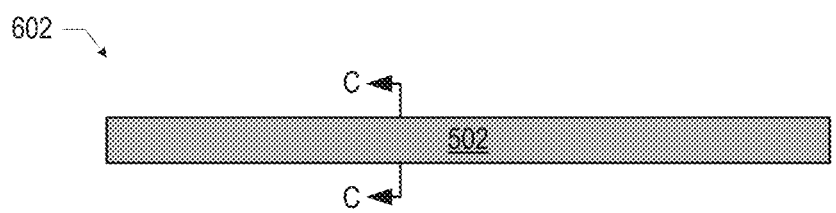
Figure 2C:
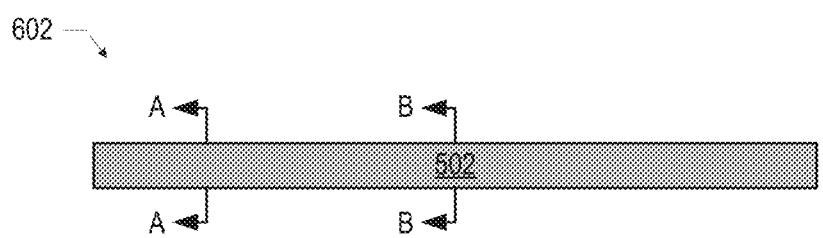

The S/D electrodes 504 may have a width 590 between 1 and 10 nanometers (e.g., 5 nanometers). Smaller S/D electrodes 504 may be suitable for higher temperature (e.g., room temperature) operation; for example, the width 590 may between 1 and 5 nanometers (e.g., 2 nanometers). In some embodiments, the width 520 of the gate electrode 506 may be the same as the width 590 of the S/D electrodes 504. In some embodiments, the width 520 of the gate electrode 506 may be different from the width 590 of the S/D electrodes 504. Generally, the width 520 of the gate electrode 506 may take the form of any of the embodiments discussed herein with reference to the width 590 of the S/D electrodes 504. In some embodiments, the spacing 587 of the S/D electrodes 504 and the gate support 516, as shown in FIG. 1A, may be between 80 and 200 nanometers (e.g., 100 nanometers).

As illustrated in FIG. 1, in some embodiments, the dielectric 508 may laterally extend beyond the area between the two S/D supports 514 (e.g., in the dimension indicated by the arrow 511). The dielectric 508 may also laterally extend beyond the area between the two S/D electrodes 504. Similarly, in some embodiments, the island 512 may laterally extend beyond the area between the two S/D supports 514, and the island 512 may laterally extend beyond the area between the two S/D electrodes 504. In some embodiments, the footprint of the dielectric 508 may have a lateral dimension 530 (in the direction of the axis between the S/D electrodes 504) between 25 and 105 nanometers (e.g., between 40 and 50 nanometers). In some embodiments, the island 512 may have a lateral dimension 585 (in the direction of the axis between the S/D electrodes 504) between 25 and 100 nanometers (e.g., 40 nanometers). In some embodiments, the dielectric 508 may have a lateral dimension 528 (perpendicular to the axis between the S/D electrodes 504) between 25 and 100 nanometers (e.g., 40 nanometers).

Generally, the smaller the island 512, the better the charge sensitivity of any of the SET devices 100 disclosed herein for a given temperature when the self-capacitance of the SETs is the dominant capacitance. In particular, the SET device 100 may have an associated charging energy, representative of the rate of change of conductance in response to proximate charges; a larger charging energy represents greater sensitivity to proximate charges. The charging energy may be inversely proportional to the self-capacitance of the island 512, and the self-capacitance of the island may be proportional to the size of the island 512. As the temperature of the environment of a SET device 100 increases (e.g., to room temperature), the sensitivity of the SET device 100 is typically compromised. Larger charging energies may help a SET device 100 achieve an adequate sensitivity at higher temperatures (e.g., room temperature), and thus smaller islands 512 may be advantageous in SET devices 100 that are to operate at these higher temperatures when self-capacitance of the islands 512 are the dominant capacitances.

Any suitable materials may be used in the SET device 100 of FIG. 1. The S/D supports 514 and the gate support 516 may be "dummy" structures that provide a mechanical support against which the S/D electrodes 504 and the gate electrode 506 may be formed, respectively. In some embodiments, the S/D supports 514 and the gate support 516 may be formed from an insulating material, such as an oxide. The S/D electrodes 504 and the gate electrode 506 may be formed from any suitable conductive material, such as a metal. In some embodiments, the S/D electrodes 504 and the gate electrode 506 may be formed of a noble metal, which may provide advantageous resistance to corrosion during manufacture and thereby facilitate the reliable construction of the TJs 570 (due to the absence of oxide interference).

The insulator 510 may be a suitable dielectric material, such as any interlayer dielectric (ILD) material. The dielectric 508 may be silicon oxide, carbon-doped oxide, or any suitable low-k dielectric material. The island 512 may be a semiconductor material (e.g., silicon) or a metal (e.g., a noble metal, such as copper or platinum), in various embodiments.

Figure 1F:
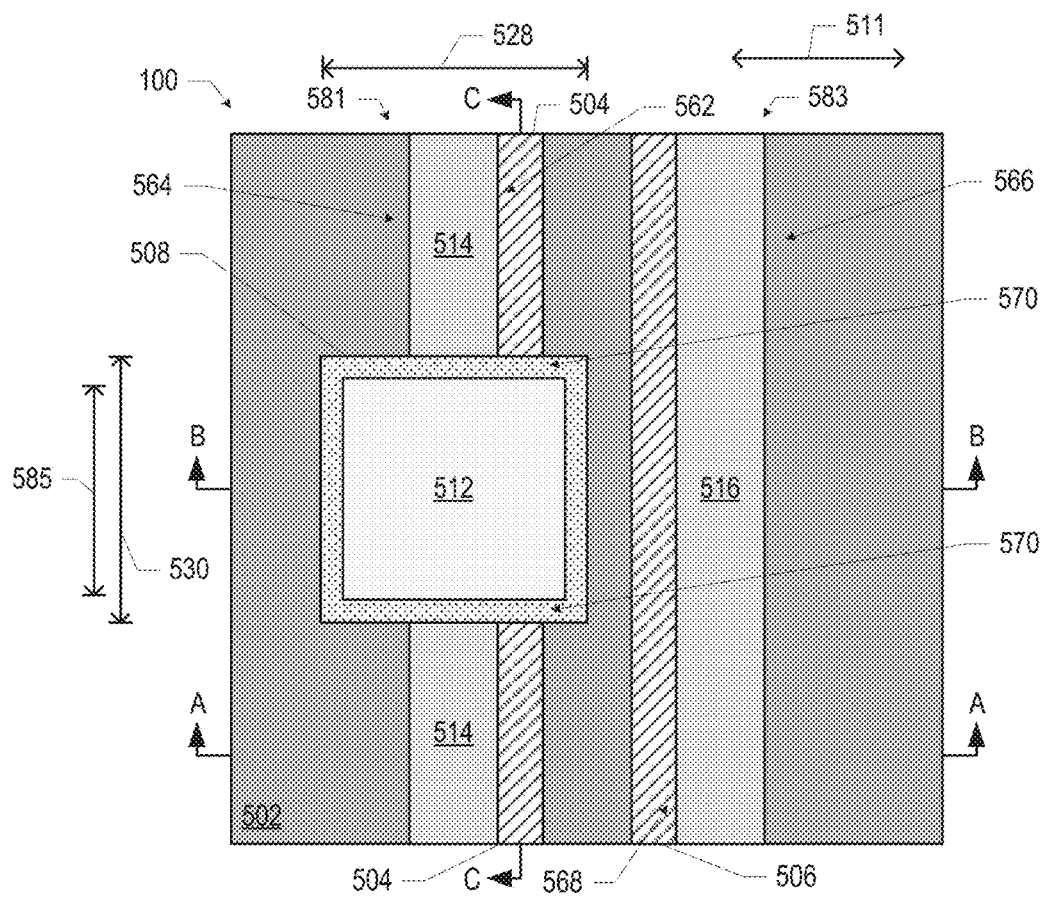

Although a single SET device 100 is illustrated in FIG. 1, a device may include an array of SET devices 100 (e.g., by tiling the SET device 100 illustrated in FIG. 1F in a one-dimensional or two-dimensional array, alternating the S/D structures 581 and the gate structures 583).

Any suitable process may be used to manufacture the SET device 100 of FIG. 1. For example, FIGS. 2-13 depict various cross-sectional views of stages in an example process for manufacturing the SET device 100 of FIG. 1. The materials and dimensions of various components of the stages illustrated in FIGS. 2-13 may take the form of any of the embodiments discussed herein. In FIGS. 2-13, the "A" sub-figures represent cross-sectional views through the section A-A (analogous to FIG. 1A), the "B" sub-figures represent cross-sectional views through the section B-B (analogous to FIG. 1B), and the "C" sub-figures represent cross-sectional views through the section C-C (analogous to FIG. 1C).

FIG. 2 depicts an assembly 602 including a substrate 502. The substrate 502 may take any of the forms discussed above with reference to FIG. 1; for example, the substrate 502 may be a semiconductor wafer or a structure disposed on a semiconductor wafer.

Figure 3A:
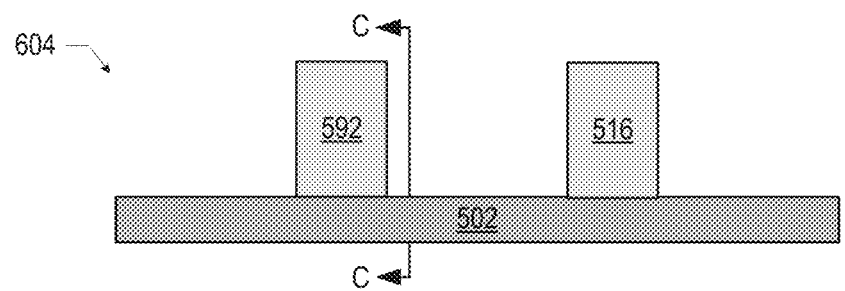
Figure 3B:
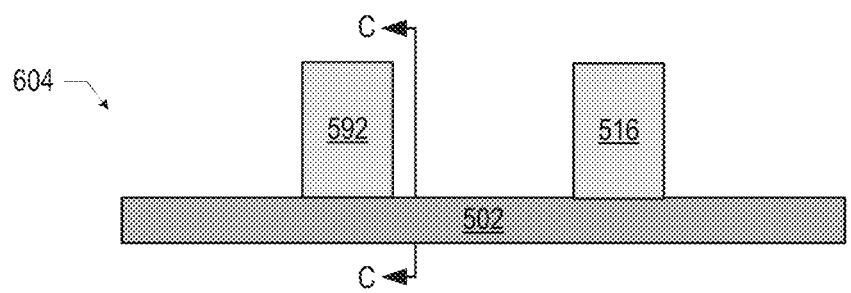
Figure 3C:
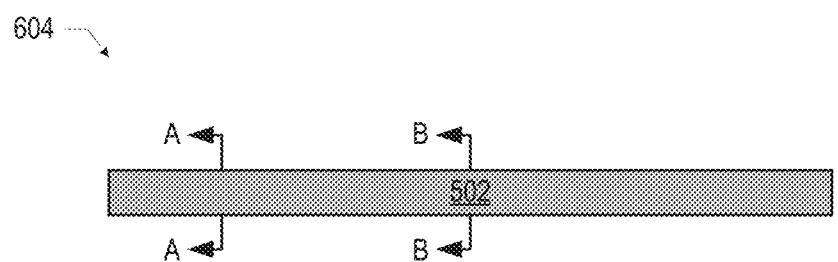

FIG. 3 depicts an assembly 604 subsequent to providing support material 592 and the gate support 516 on the substrate 502 of the assembly 604 (FIG. 2). In some embodiments, the support material 592 and the gate support 516 may each be shaped substantially as a rectangular solid. The support material 592 and the gate support 516 may each take the form of "fins" extending from the substrate 502, and may be formed using any suitable technique. For example, in some embodiments, an insulating material may be blanket-deposited on the substrate 502, and patterned to form the support material 592 and the gate support 516. In other embodiments, a sacrificial material may be blanket-deposited on the substrate 502, trenches may be formed in the sacrificial material down to the substrate 502, the trenches may be filled with insulating material to form the support material 592 and the gate support 516, and then the sacrificial material may be removed. These embodiments are simply examples, and any desired technique may be used to form the support material 592 and the gate support 516 on the substrate 502.

Figure 4A:
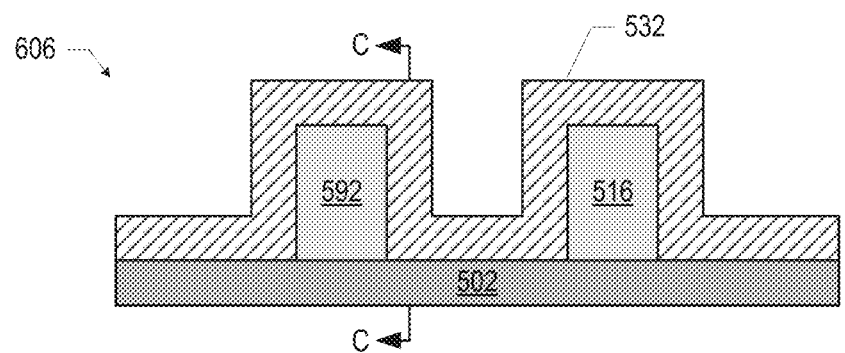
Figure 4B:
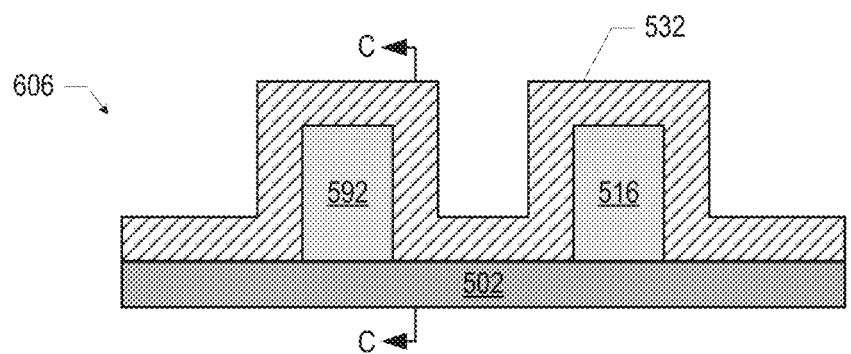
Figure 4C:
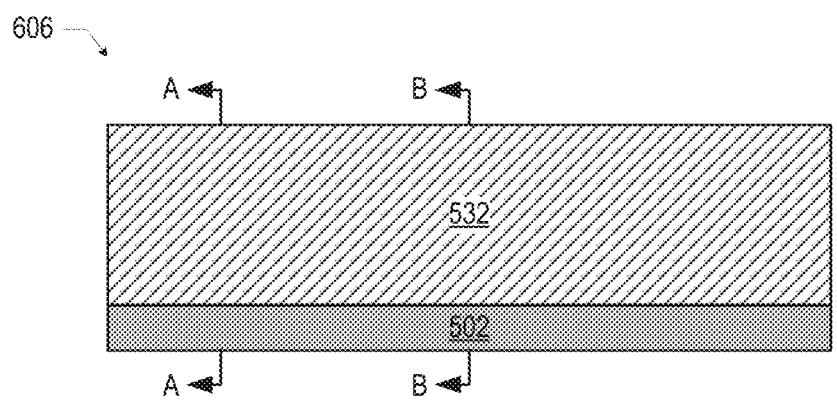

FIG. 4 depicts an assembly 606 subsequent to depositing conductive material 532 on the assembly 604 (FIG. 3). In some embodiments, the conductive material 532 may be conformally deposited on the assembly 604, extending over the support material 592 and the gate support 516 and the exposed substrate 502, to a desired thickness. The thickness of the conductive material 532 may be substantially equal to the widths 590 and 520, discussed above. Such conformal deposition may be performed by, for example, atomic layer deposition (ALD). Using ALD to deposit the conductive material 532 may allow the thickness of the deposition to be very well controlled, helping achieve a small and reliably sized SET device 100.

Figure 5A:
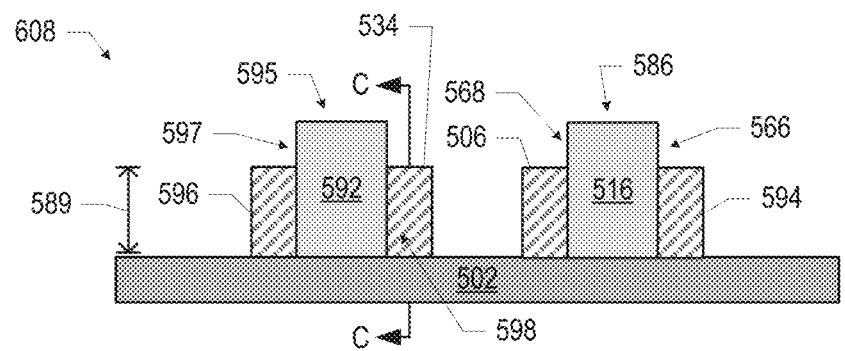
Figure 5B:
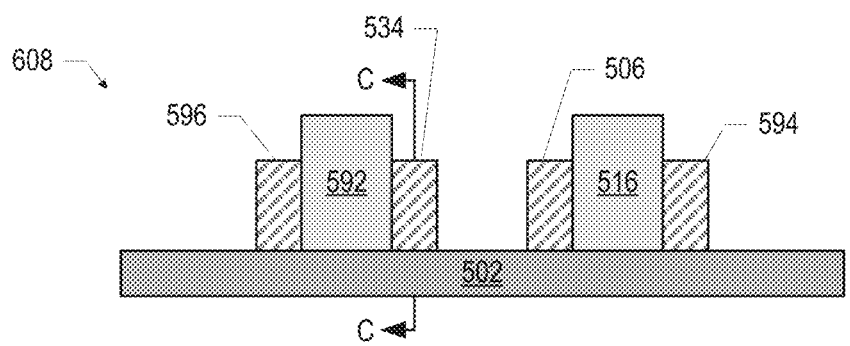
Figure 5C:
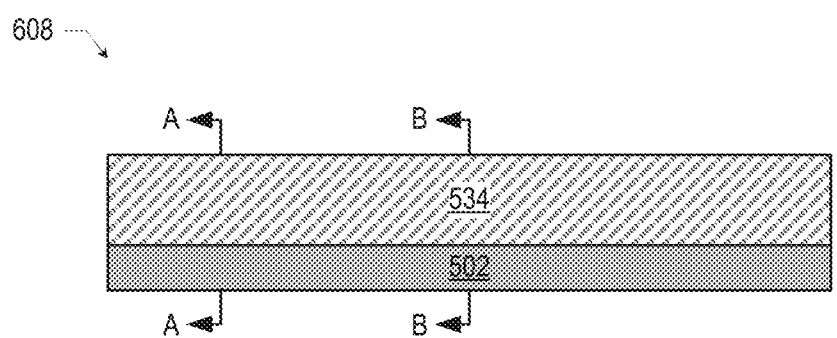

FIG. 5 depicts an assembly 608 subsequent to directionally etching back the conductive material 532 of the assembly 606 (FIG. 4) to remove a desired thickness of the conductive material 532 in the "vertical" direction and leave a desired height 589 of the conductive material 532. The height 589 may be equal to the height 526 discussed above. In particular, the conductive material 532 may be removed from the top face 595 of the support material 592, the top face 586 of the gate support 516, and from exposed areas of the substrate 502 where the thickness of the conductive material 532 was less than or equal to the thickness removed. The directional etching may leave portions of the conductive material 532 on the side faces of the support material 592 and the gate support 516. In particular, conductive material 596 may be disposed on the side face 597 of the support material 592, conductive material 534 may be disposed on the side face 598 of the support material 592, the gate electrode 506 may be disposed on the side face 568 of the gate support 516, and conductive material 594 may be disposed on the side face 566 of the gate support 516. As discussed above with reference to FIG. 1, in some embodiments, the conductive material 532 may be recessed below the top faces 595 and 586 of the support material 592 and the gate support 516, respectively. Techniques other than the directional etching described above may be used to form the assembly 608 from the assembly 606. For example, in some embodiments, a sacrificial light absorbing material (SLAM) may be deposited on the assembly 606 and recessed back to the desired height 589 (e.g., using a timed dry etch); a desired thickness of the conductive material 532 that extends beyond the SLAM may be etched away, then the SLAM may be removed and the conductive material 532 etched again to further recess the conductive material 532 on the side faces of the support material 592 and the gate support 516 and remove the conductive material 532 from exposed areas of the substrate 502.

Figure 6A:
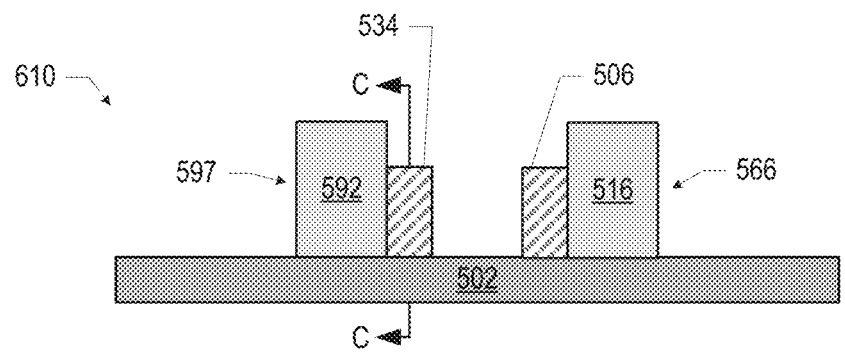
Figure 6B:
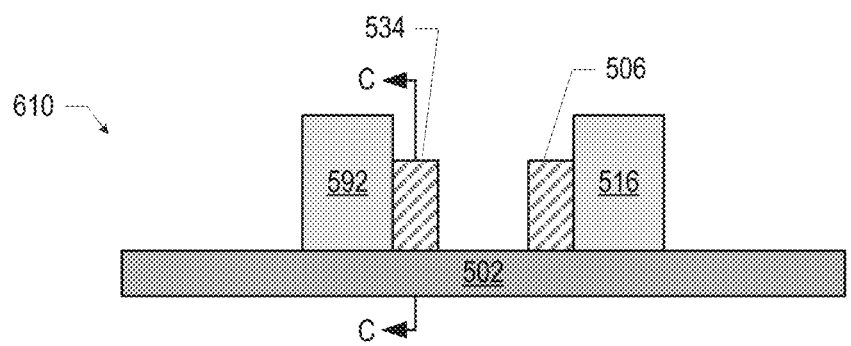
Figure 6C:
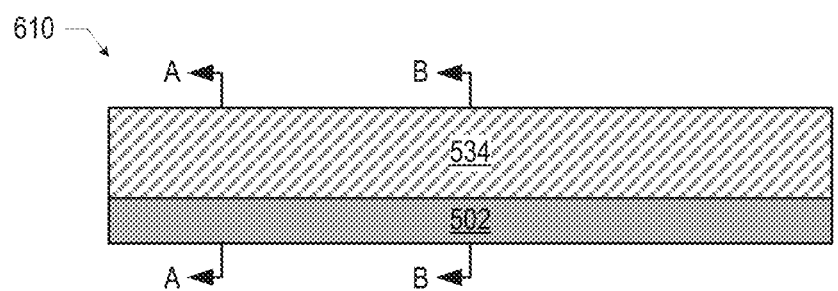

FIG. 6 depicts an assembly 610 subsequent to removing the conductive material 596 from the side face 597 of the support material 592 of the assembly 608 (FIG. 5), and removing the conductive material 594 from the side face 566 of the gate support 516 of the assembly 608. In some embodiments, the conductive material 596 and the conductive material 594 may be removed by providing an appropriate mask to the assembly 608 (that exposes the conductive material 596 and the conductive material 594) and then etching away the exposed conductive material 596 and the conductive material 594. In other embodiments, the conductive material 596 and the conductive material 594 may not be formed on the support material 592 and the gate support 516, respectively, at all. Instead, an insulating material (e.g., the insulator 510, as discussed below with reference to FIG. 7) may be deposited on the assembly 604 (FIG. 3) and polished back to expose the top face 595 of the support material 592 and the top face 586 of the gate support 516; the insulating material may be patterned to expose the substrate 502 between the support material 592 and the gate support 516; the conductive material 532 may be conformally deposited on this assembly (e.g., using the techniques discussed above with reference to FIG. 4); and then a directional etch may be performed on the conductive material 532, resulting in an assembly similar to that illustrated in FIG. 6 but with insulating material on the side face 597 of the support material 592 and the side face 566 of the gate support 516. This assembly may be processed in substantially the same manner as discussed below, and thus represents one alternative approach to that explicitly illustrated in FIGS. 2-13.

Figure 7A:
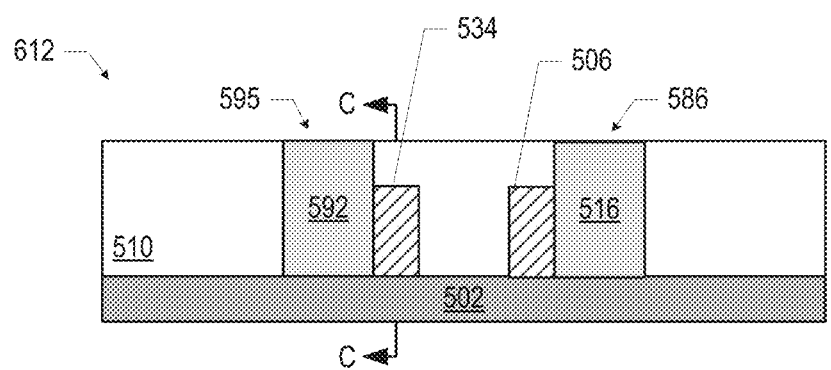
Figure 7B:
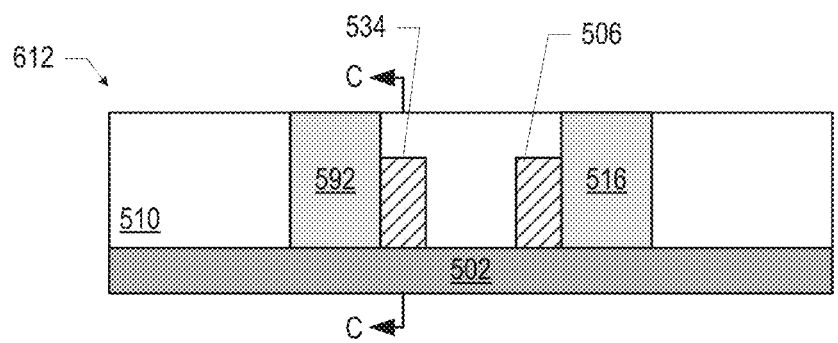
Figure 7C:
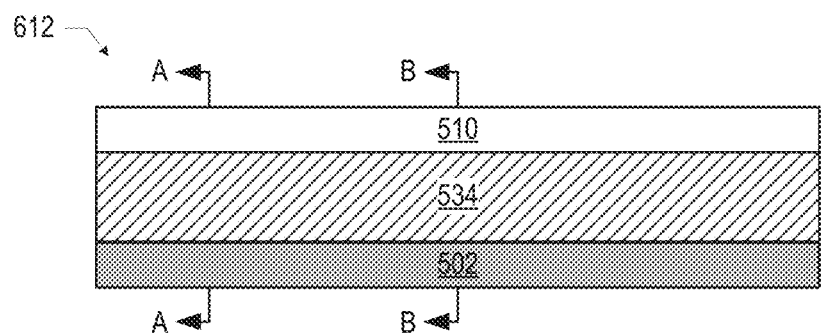

FIG. 7 depicts an assembly 612 subsequent to depositing an insulator 510 on the assembly 610 (FIG. 6). In the assembly 612, the top face 595 of the support material 592 and the top face 586 of the gate support 516 are shown as exposed, but in other embodiments, the insulator 510 may extend over the top face 595 and the top face 586. In some embodiments, deposition of the insulator 510 may be followed by a polishing step in which the insulator 510 is polished to create a flat face (e.g., by chemical mechanical polishing); in some such embodiments, the top face 595 and the top face 586 may be exposed subsequent to polishing.

Figure 8A:
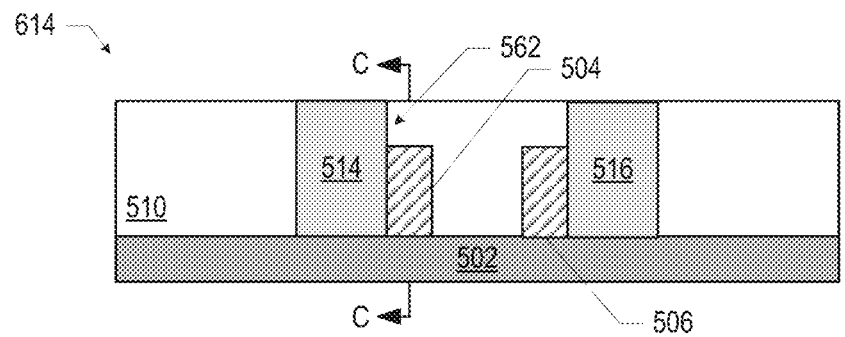
Figure 8B:
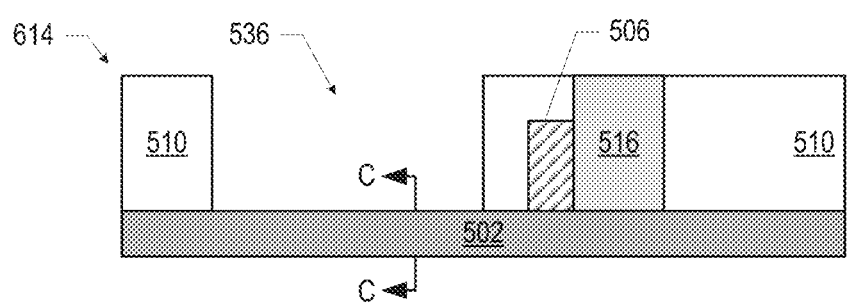
Figure 8C:
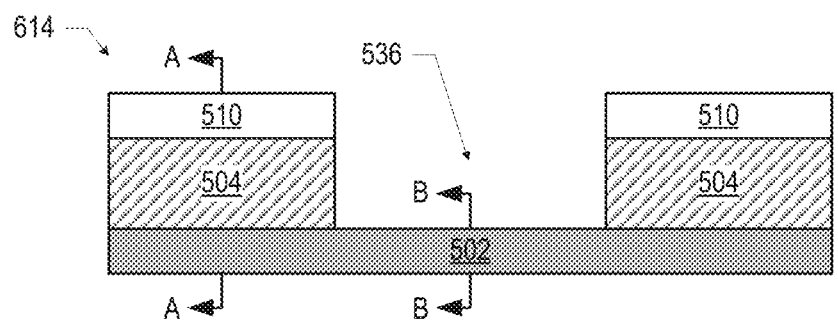

FIG. 8 depicts an assembly 614 subsequent to forming a recess 536 in the assembly 612 (FIG. 7). The recess 536 may have the footprint of the dielectric 508 illustrated in FIG. 1F (e.g., a substantially rectangular footprint), and may divide the support material 592 of FIG. 7 into the two S/D supports 514, and thus the lateral dimensions of the recess 536 may take any of the forms of the lateral dimensions 530 and 528 discussed herein. The recess 536 may similarly divide the conductive material 534 into two S/D electrodes 504 (disposed on the side faces 562 of the S/D supports 514). The recess 536 may be spaced apart from the gate electrode 506 by a portion of the insulator 510, as shown. Any suitable technique may be used to form the recess 536, and the appropriate technique may depend on the desired dimensions of the recess 536. In some embodiments, the recess 536 may be formed by a hole shrink technique, or extreme ultraviolet lithography, for example.

Figure 9A:
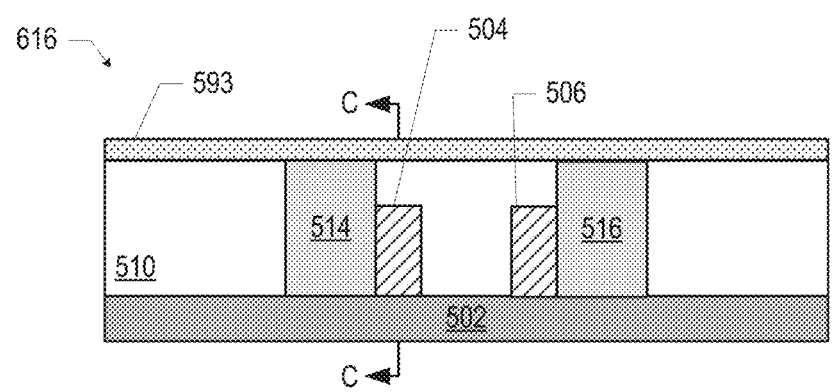
Figure 9B:
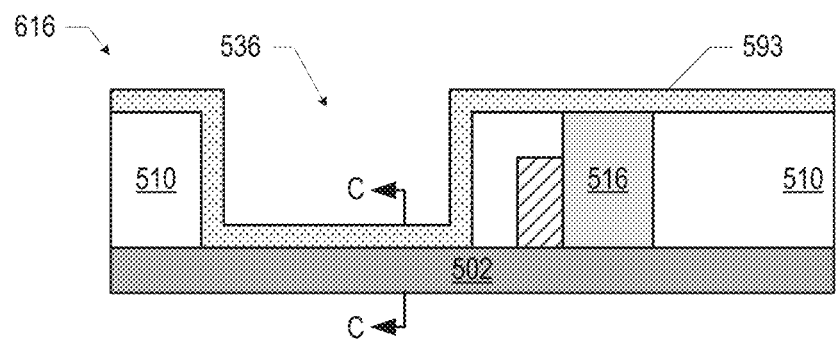
Figure 9C:
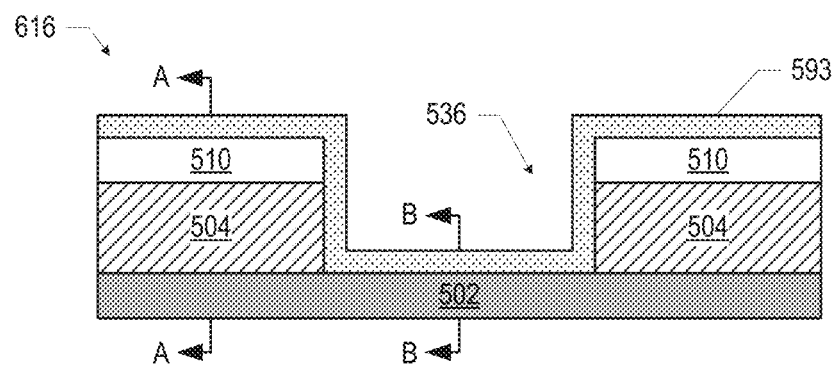

FIG. 9 depicts an assembly 616 subsequent to conformally depositing a dielectric material 593 on the assembly 614 (FIG. 8). The dielectric material 593 may be the material of the dielectric 508 (as discussed below), and it may be deposited on the sidewalls and bottom of the recess 536, as shown. The thickness of the dielectric material 593 may be substantially equal to the thickness 524, discussed above. Such conformal deposition may be performed by, for example, ALD (which may provide a desirably well-controlled deposition thickness).

Figure 10A:
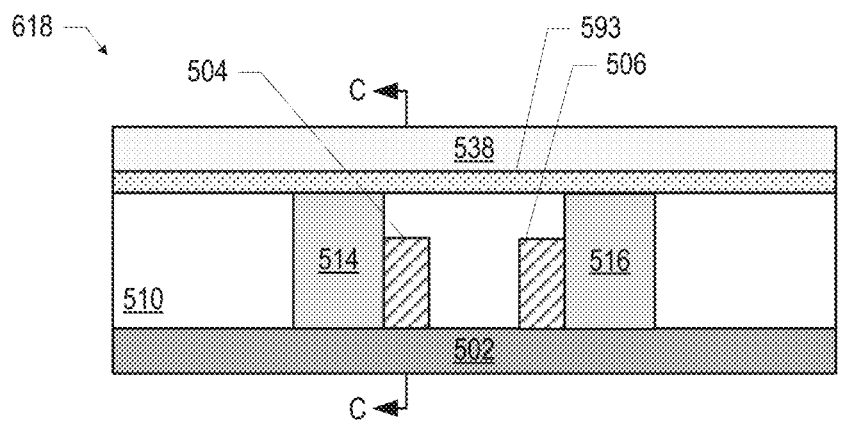
Figure 10B:
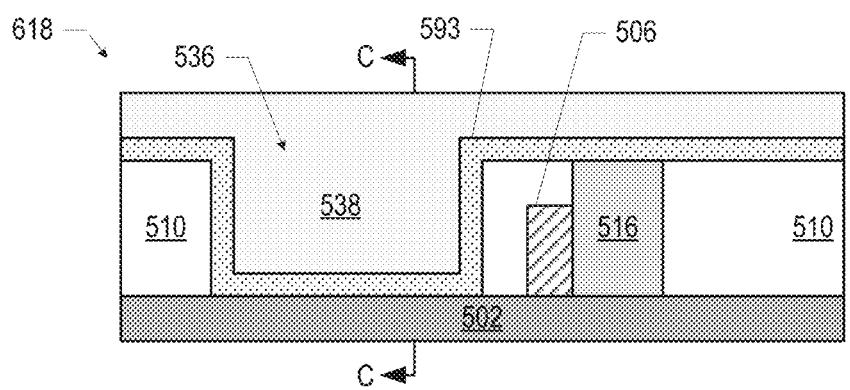
Figure 10C:
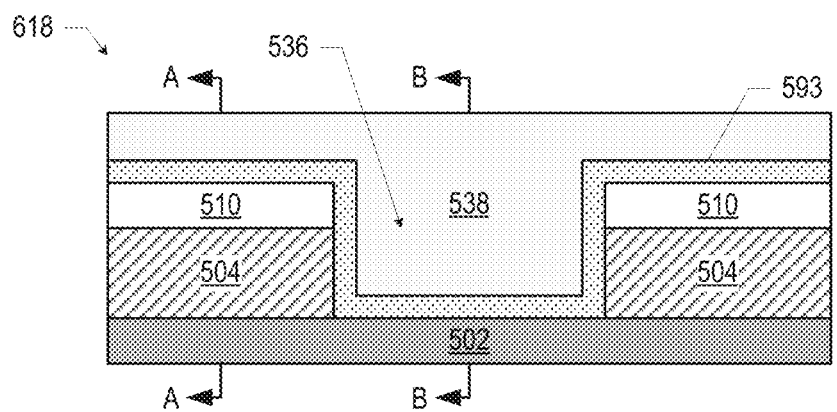

FIG. 10 depicts an assembly 618 subsequent to depositing an island material 538 on the assembly 616 (FIG. 9). The island material 538 may, as illustrated in FIG. 10, fill the recess 536, and in some embodiments, may extend beyond the recess 536 and over the S/D supports 514 and the gate support 516. The island material 538 may be deposited using any suitable technique, such as chemical vapor deposition (CVD) or atomic layer deposition (ALD).

Figure 11A:
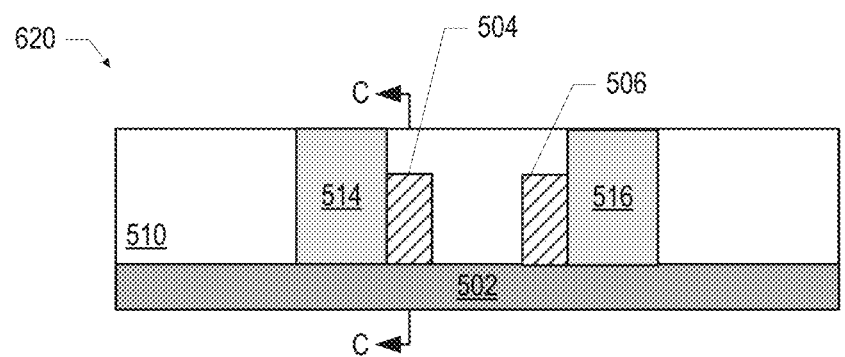
Figure 11B:
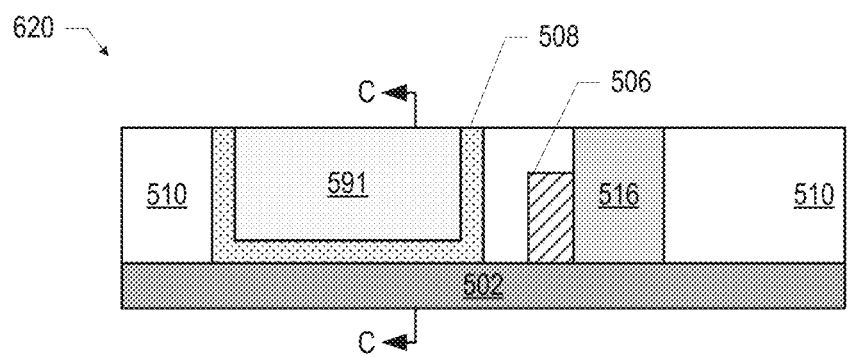
Figure 11C:
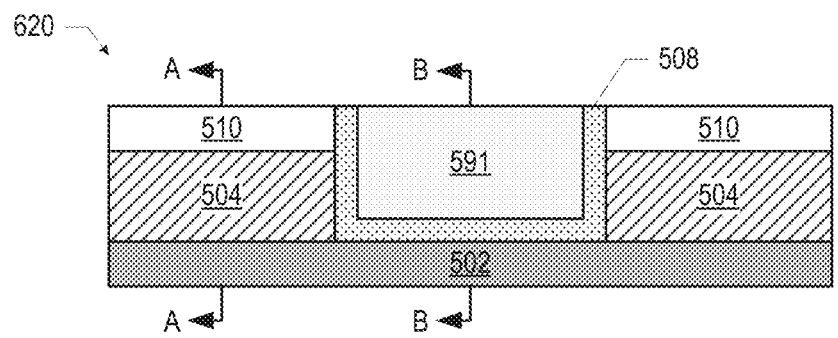

FIG. 11 depicts an assembly 620 subsequent to polishing the assembly 618 (FIG. 10) to remove the dielectric material 593 and the island material 538 that extended beyond the recess 536 in the assembly 618, forming the dielectric 508 and island material 591, respectively. In some embodiments, a CMP technique may be used to polish the assembly 618. In some embodiments, this polishing operation may not remove all of the dielectric material 593 that extends beyond the recess 536; some or all of that "excess" dielectric material 593 may remain in the assembly 620.

Figure 12A:
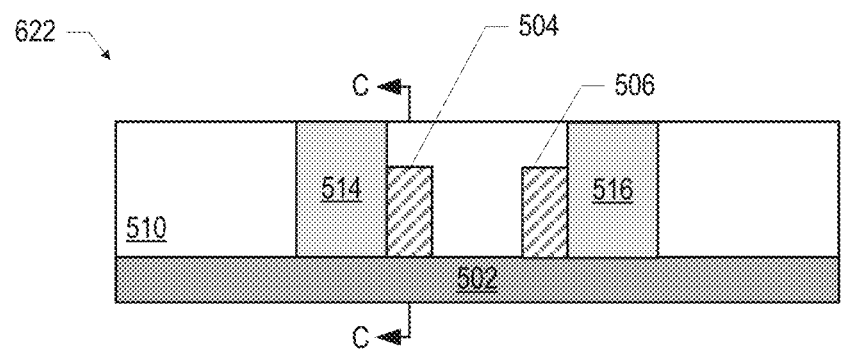
Figure 12B:
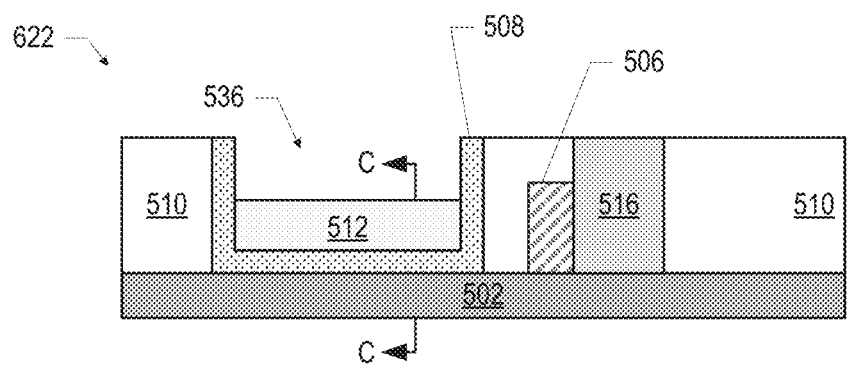
Figure 12C:
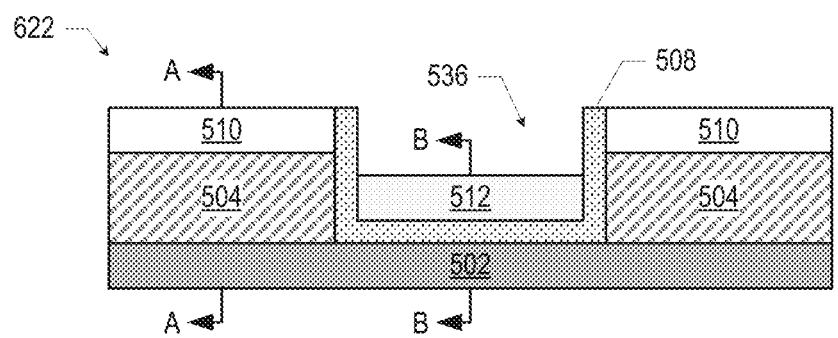

FIG. 12 depicts an assembly 622 subsequent to recessing the island material 591 of the assembly 620 (FIG. 11) back into the recess 536 to form the island 512. The island material 591 may be recessed using any suitable technique (e.g., using a dry etch, followed by a wet clean, as appropriate for the material composition of the island material 591).

Figure 13A:
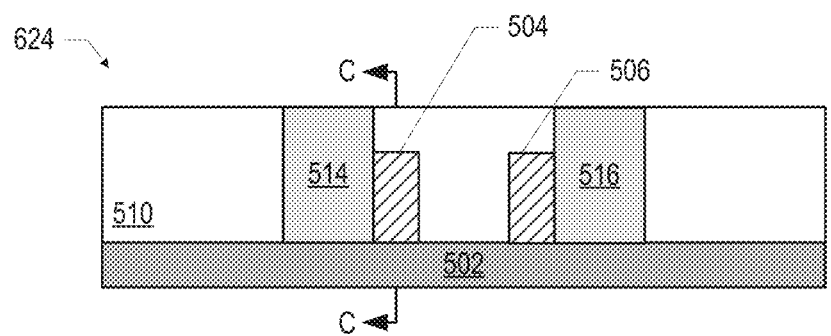
Figure 13B:
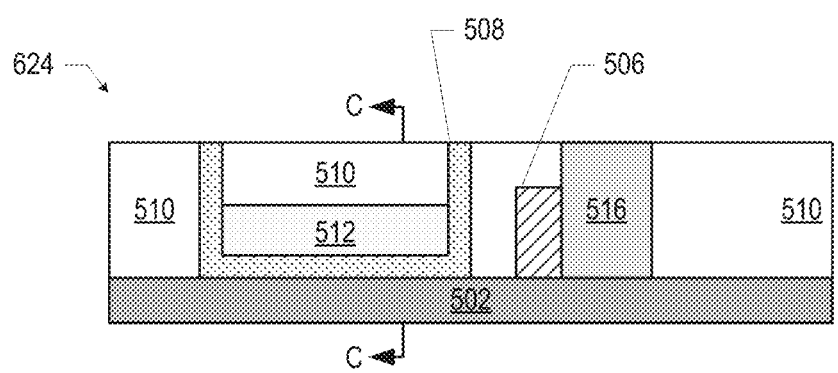
Figure 13C:
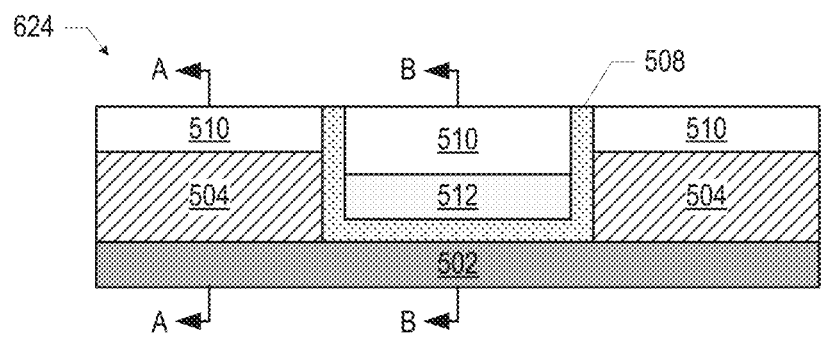
Figure 14A:
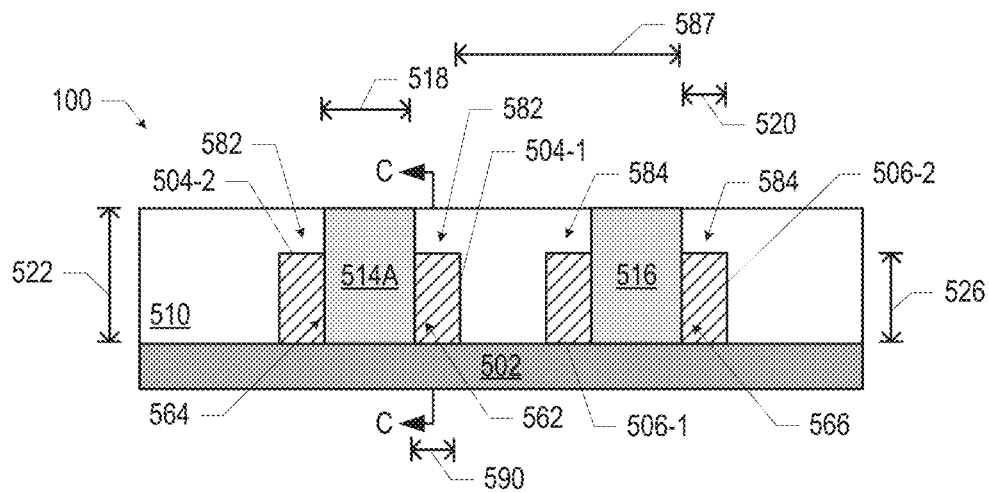
FIGS. 14A-14F are various views of another SET device, in accordance with various embodiments.
Figure 14B:
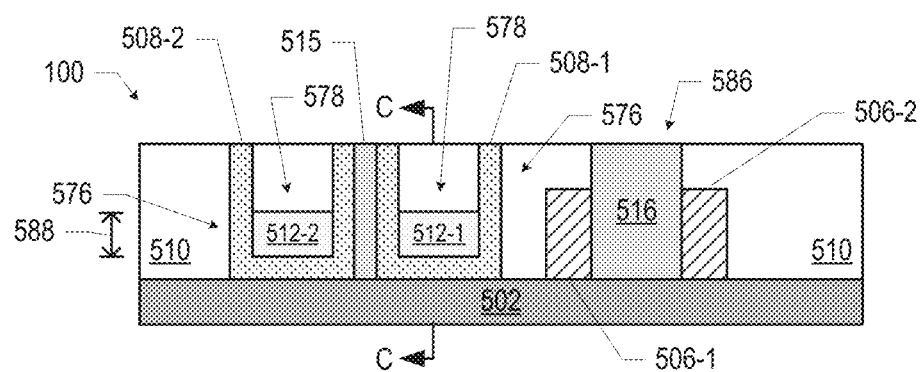
Figure 14C:
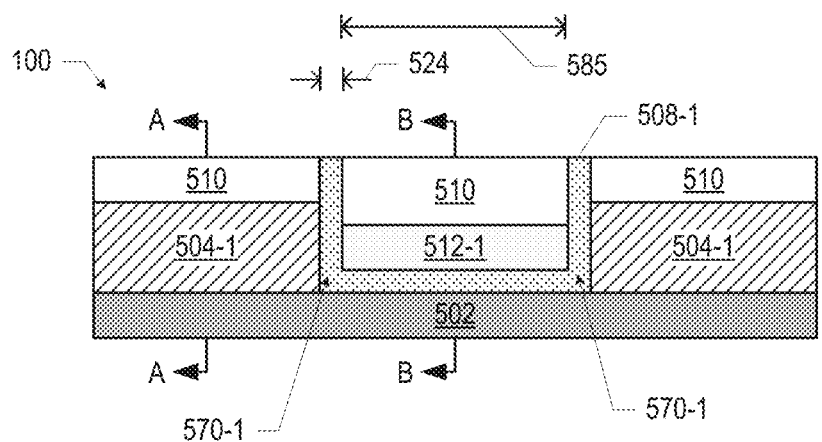
Figure 14D:
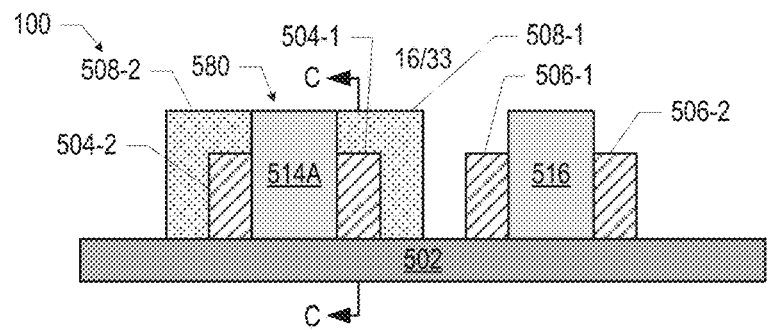
Figure 14E:
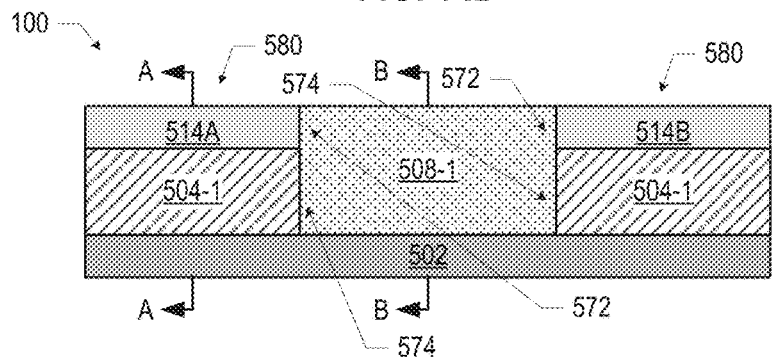
Figure 14F:
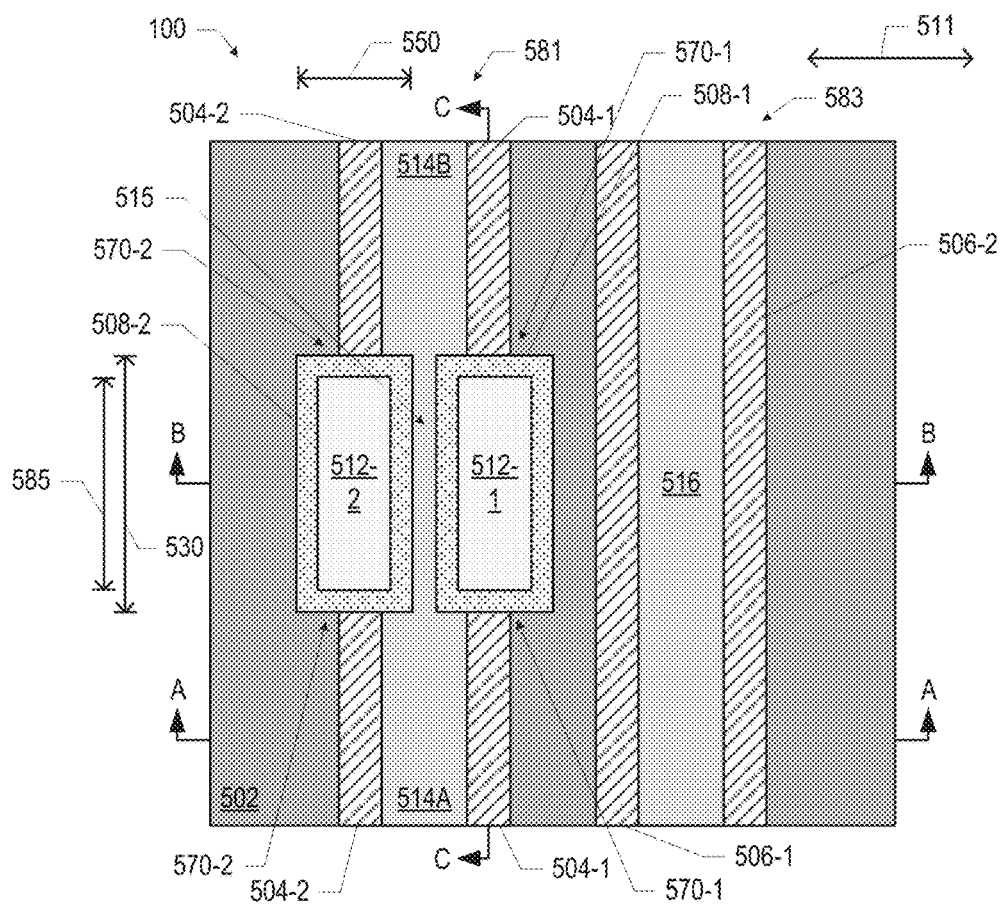

FIG. 13 depicts an assembly 624 subsequent to providing additional insulator 510 in the recess 536 of the assembly 622 (FIG. 12) above the island 512. The additional insulator 510 may be provided using any of the techniques discussed above with reference to FIG. 7. The assembly 624 may take the form of the SET device 100 discussed above with reference to FIG. 1. In some embodiments, the additional insulator 510 may extend beyond the recess 536, and may be deposited over all of the assembly 622; this is not shown in FIG. 13 for economy of illustration. As discussed below with reference to FIG. 25, conductive pathways (including, e.g., conductive vias) may extend through the insulator 510 to make contact with the S/D electrodes 504 and the gate electrode 506.

FIG. 14 provides various views of a second embodiment of a SET device 100. In particular, FIG. 14A is a cross-sectional view of the SET device 100 through the section A-A of FIGS. 14C, 14E, and 14F; FIG. 14B is a cross-sectional view of the SET device 100 through the section B-B of FIGS. 14C, 14E, and 14F; FIG. 14C is a cross-sectional view of the SET device 100 through the section C-C of FIGS. 14A, 14B, 14D, and 14F; FIG. 14D is a side view of the SET device 100 toward the section A-A with the insulator 510 removed; FIG. 14E is a side view of the SET device 100 toward the section C-C from the gate electrode 506-1 with the insulator 510 removed; and FIG. 14F is a top view of the SET device 100 with the insulator 510 removed. As discussed below, FIG. 14 depicts one complete SET, and two "halves" of additional SETs 100.

As illustrated in FIG. 14, the SET device 100 may include an S/D structure 581 including two source/drain (S/D) supports 514A and 514B disposed on a substrate 502. The S/D structure 581 may also include support material 515 between the S/D supports 514A and 514B. In some embodiments, the S/D supports 514A and 514B and the support material 515 may be materially contiguous (e.g., as discussed below with reference to FIGS. 15-16). Reference to an "S/D support 514" may refer to both the S/D supports 514A and 514B. Each S/D support 514 may have an S/D electrode 504-1 disposed on a side face 562 of the S/D support 514. Two S/D electrodes 504-1 of the S/D structure 581 may be spaced apart by intervening dielectric 508-1 and an island 512-1. In particular, a SET may include two TJs 570-1, each formed by a portion of dielectric 508-1 "sandwiched" between an S/D electrode 504-1 and the island 512-1.

A gate structure 583 including a gate support 516 may also be disposed on the substrate 502. The gate structure 583 may also include a gate electrode 506-1 disposed on a side face 568 of the gate support 516. During use, as discussed above with reference to FIG. 1, voltages may be applied to the gate electrode 506-1 and the S/D electrodes 504-1 to control electron transport and electron occupancy in the island 512-1; the gate electrode 506-1, the S/D electrodes 504-1, the dielectric 508-1, and the island 512-1 may thus together provide a SET.

FIG. 14 also illustrates portions of additional SETs. In particular, the S/D structure 581 may include additional S/D electrodes 504-2 disposed on the side faces 564 of the S/D supports 514 (opposite to the side faces 562). The two S/D electrodes 504-2 may be spaced apart by intervening dielectric 508-2 and an island 512-2. In particular, this arrangement may result in two TJs 570-2, each formed by a portion of dielectric 508-2 "sandwiched" between an S/D electrode 504-2 and the island 512-2. Similarly, the gate structure 583 may include an additional gate electrode 506-2 disposed on the side face 566 of the gate support 516 (opposite to the side face 568). If the S/D structures 581 and the gate structures 583 of FIG. 14 are repeatedly alternatingly arranged (continuing the pattern illustrated in FIG. 14), the gate electrode 506-2 of an additional gate structure 583 (not shown) disposed to the "left" of the S/D structure 581 of FIG. 14F may, together with the S/D electrodes 504-2, the dielectric 508-2, and the island 512-2, provide another SET. In this manner, an array of SETs may be formed. Use of these SETs may take the form of any of the embodiments disclosed herein.

Reference to a "dielectric 508" may refer to both the dielectrics 508-1 and 508-2, and reference to an "island 512" may refer to both the islands 512-1 and 512-2. Similarly, reference to an "S/D electrode 504" may refer to both the S/D electrodes 504-1 and 504-2, and reference to a "gate electrode 506" may refer to both the gate electrodes 506-1 and 506-2.

The dielectrics 508 of FIG. 14 may extend up the sidewalls 572 of the S/D supports 514, and up the sidewalls 574 of the S/D electrodes 504. In some embodiments, the dielectrics 508 may extend along the substrate 502 between the S/D supports 514 and the S/D electrodes 504 such that a portion of the dielectrics 508 is disposed between the islands 512 and the substrate 502. The dielectrics 508 may also extend up sidewalls 576 of the insulator 510, as shown.

The islands 512 of FIG. 14 may be disposed at the bottom of the "boxes" formed by the dielectrics 508. In some embodiments, the top faces 578 of the islands 512 may be recessed back from the top faces 580 of the S/D supports 514; in some such embodiments, portions of the insulator 510 may be disposed in the "boxes" formed by the dielectrics 508 such that the islands 512 are disposed between these portions of the insulator 510 and the substrate 502.

In some embodiments, the top faces 582 of the S/D electrodes 504 of FIG. 14 may be recessed back from the top faces 580 of the S/D supports 514. Similarly, in some embodiments, the top faces 584 of the gate electrodes 506 may be recessed back from the top face 586 of the gate support 516. The dimensions 524, 588, 526, 522, 518, 590, 520, 530, 585, and 587 of FIG. 14 may take any of the forms discussed above with reference to the SET device 100 of FIG. 1.

As illustrated in FIG. 14, in some embodiments, the dielectrics 508 may laterally extend beyond the area between the two S/D supports 514 (e.g., in the dimension indicated by the arrow 511). The dielectrics 508 may also laterally extend beyond the area between the two S/D electrodes 504. Similarly, in some embodiments, the islands 512 may laterally extend beyond the area between the two S/D supports 514, and the islands 512 may laterally extend beyond the area between the two associated S/D electrodes 504. In some embodiments, the dielectric 508 may have a lateral dimension 550 (perpendicular to the axis between the S/D electrodes 504) between 10 and 50 nanometers (e.g., 20 nanometers).

Any suitable materials discussed above with reference to the SET device 100 of FIG. 1 may be used in the SET device 100 of FIG. 14. Additionally, although a single complete SET is illustrated in FIG. 14 (and a one-dimensional array of the SETs of FIG. 14 is discussed above), a device may include a two-dimensional array of the SETs illustrated in FIG. 14 (or any other arrangement of multiple SETs).

Any suitable process may be used to manufacture the SET device 100 of FIG. 14. For example, FIGS. 15-18 depict various cross-sectional views of stages in an example process for manufacturing the SET device 100 of FIG. 14. The materials and dimensions of various components of the stages illustrated in FIGS. 15-18 may take the form of any of the embodiments discussed herein. In FIGS. 15-18, the "A" sub-figures represent cross-sectional views through the section A-A (analogous to FIG. 14A), the "B" sub-figures represent cross-sectional views through the section B-B (analogous to FIG. 14B), and the "C" sub-figures represent cross-sectional views through the section C-C (analogous to FIG. 14C).

Figure 15A:
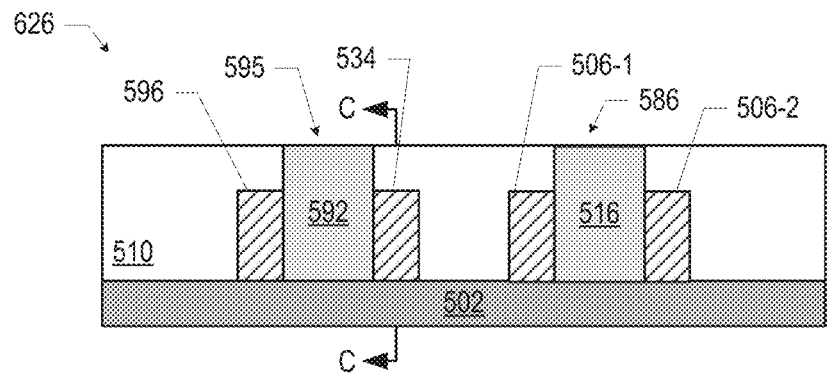
FIGS. 15A-15C, 16A-16C, 17A-17C, and 18A-18C illustrate various example stages in the manufacture of the SET device of FIGS. 14A-14F, in accordance with various embodiments.
Figure 15B:
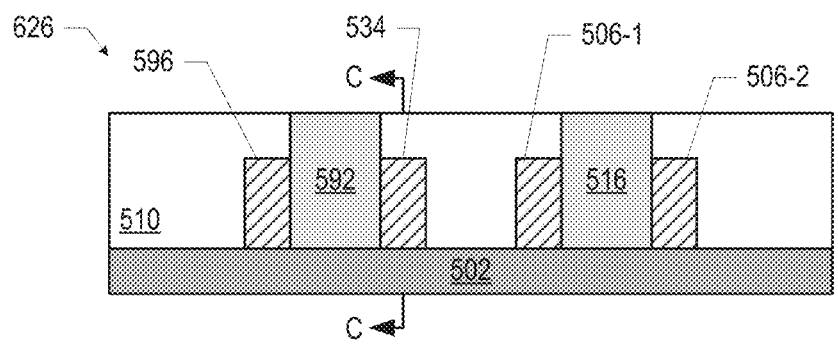
Figure 15C:
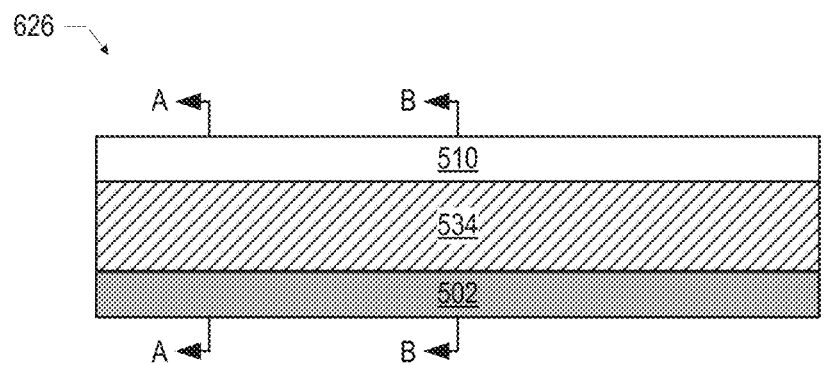

FIG. 15 depicts an assembly 626 subsequent to depositing an insulator 510 on the assembly 608 (FIG. 5). In contrast to the manufacturing process discussed above with reference to FIG. 1, the conductive material 596 disposed on the side face 597 of the support material 592 may not be removed (as discussed above with reference to FIG. 6); similarly, the conductive material 594 disposed on the side face 566 of the gate support 516 in FIG. 5 may not be removed. In FIG. 15, the conductive material 594 is relabeled as 506-2, consistent with FIG. 14, and the gate electrode 506 of FIG. 5 is relabeled as the gate electrode 506-1. In the assembly 626, the top face 595 of the support material 592 and the top face 586 of the gate support 516 are shown as exposed, but in other embodiments, the insulator 510 may extend over the top face 595 and the top face 586. In some embodiments, deposition of the insulator 510 may be followed by a polishing step in which the insulator 510 is polished to create a flat face (e.g., by chemical mechanical polishing); in some such embodiments, the top face 595 and the top face 586 may be exposed subsequent to polishing.

Figure 16A:
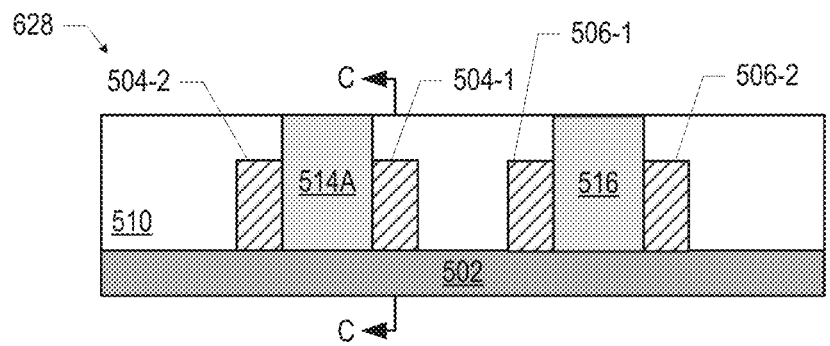
Figure 16B:
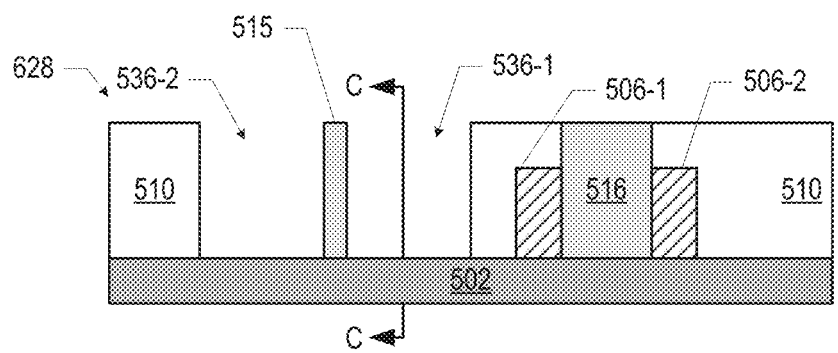
Figure 16C:
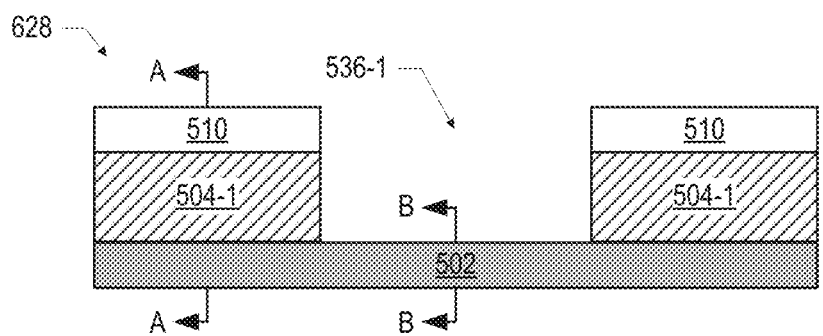

FIG. 16 depicts an assembly 628 subsequent to forming two recesses 536-1 and 536-2 in the assembly 626 (FIG. 15). Reference to a "recess 536" may refer to both the recesses 536-1 and 536-2. The recesses 536 may have the footprints of the dielectrics 508 illustrated in FIG. 14F (e.g., substantially rectangular footprints), and may divide the support material 592 of FIG. 15 into the two S/D supports 514A and 514B, joined by the support material 515. The lateral dimensions of the recesses 536 may take any of the forms of the lateral dimensions 550 and 530 discussed herein. The recess 536-1 may divide the conductive material 534 into two S/D electrodes 504-1 (disposed on the side faces 562 of the S/D supports 514), and the recess 536-2 may divide the conductive material 534 into two S/D electrodes 504-2 (disposed on the side faces 564 of the S/D supports 514). The recess 536-1 may be spaced apart from the gate electrode 506-1 by a portion of the insulator 510, as shown. The recesses 536-1 and 536-2 may be spaced apart from each other by the support material 515. The recesses 536-1 and 536-2 may be formed using any of the techniques discussed above with reference to FIG. 8.

Figure 17A:
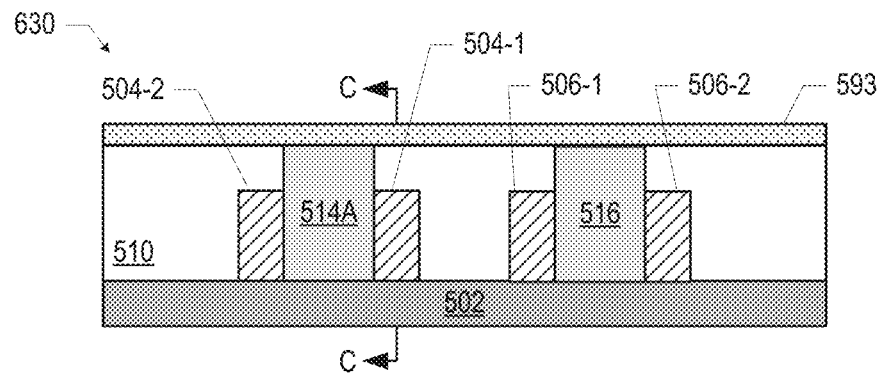
Figure 17B:
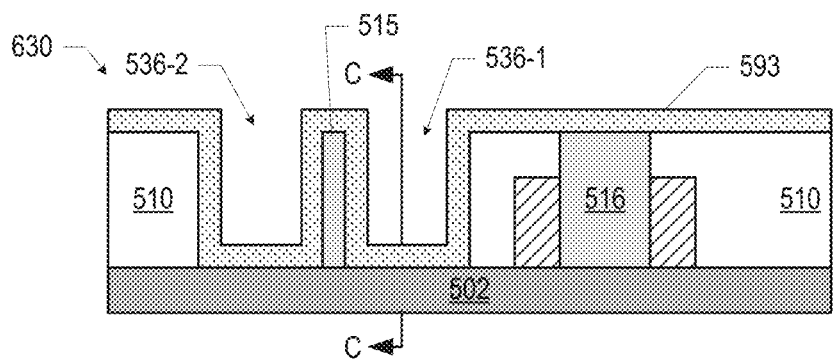
Figure 17C:
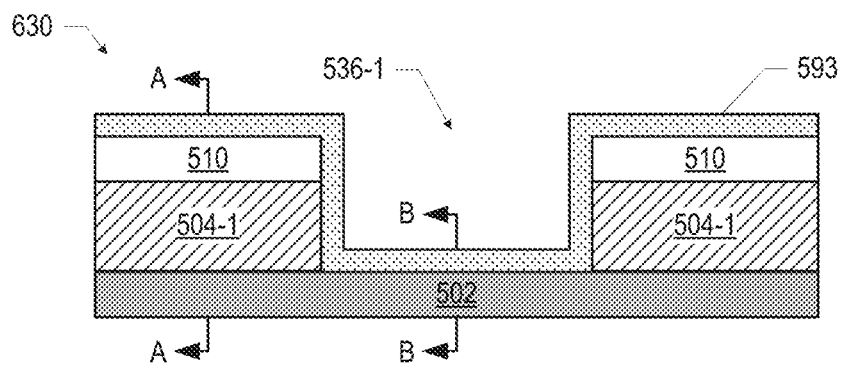

FIG. 17 depicts an assembly 630 subsequent to conformally depositing a dielectric material 593 on the assembly 628 (FIG. 16). The dielectric material 593 may be the material of the dielectrics 508, and it may be deposited on the sidewalls and bottom of the recesses 536-1 and 536-2, as shown. The thickness of the dielectric material 593 may be substantially equal to the thickness 524, discussed above. Such conformal deposition may be performed by, for example, ALD.

Figure 18A:
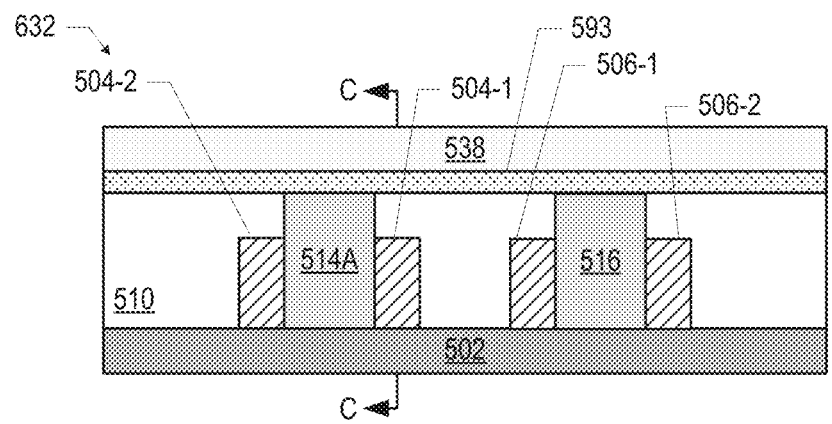
Figure 18B:
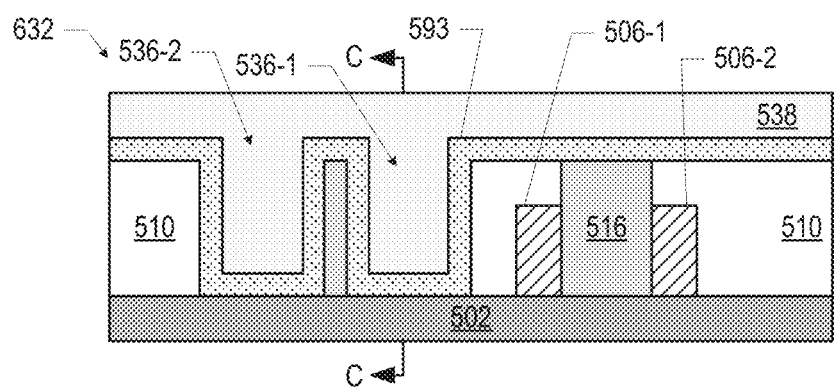
Figure 18C:
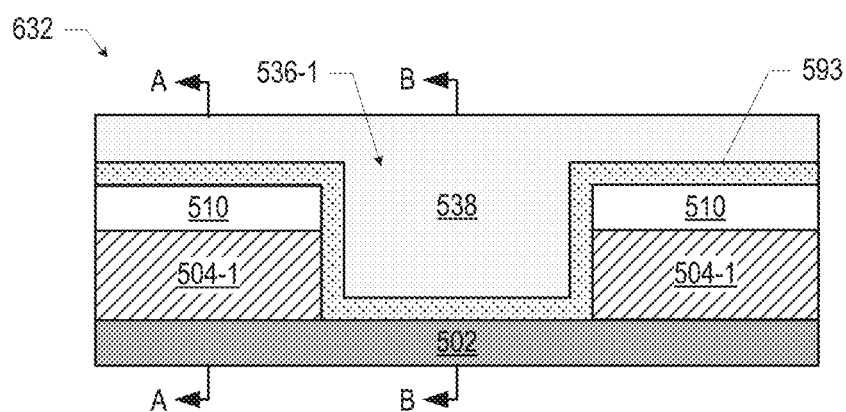

FIG. 18 depicts an assembly 632 subsequent to depositing an island material 538 on the assembly 630 (FIG. 17). The island material 538 may, as illustrated in FIG. 18, fill the recesses 536, and in some embodiments, may extend beyond the recess 536 and over the S/D supports 514 and the gate support 516. The island material 538 may be deposited using any suitable technique, such as those discussed above with reference to FIG. 10. The assembly 632 may be further processed as discussed above with reference to FIGS. 11-13 to form the SET device 100 illustrated in FIG. 14.

FIG. 19 provides various views of a third embodiment of a SET device 100. In particular, FIG. 19A is a cross-sectional view of the SET device 100 through the section A-A of FIGS. 19C, 19E, and 19F; FIG. 19B is a cross-sectional view of the SET device 100 through the section B-B of FIGS. 19C, 19E, and 19F; FIG. 19C is a cross-sectional view of the SET device 100 through the section E-E of FIGS. 19A, 19B, 19D, and 19F; FIG. 19D is a side view of the SET device 100 toward the section A-A with the insulator 510 removed; FIG. 19E is a side view of the SET device 100 toward the section E-E from the gate electrodes 506 with the insulator 510 removed; and FIG. 19F is a top view of the SET device 100 with the insulator 510 removed.

As illustrated in FIG. 19, the SET device 100 may include an S/D structure 581 including S/D electrodes 504 disposed on a substrate 502. The S/D electrodes 504 of the S/D structure 581 may be spaced apart by intervening dielectric 508 and an island 512. The S/D structure 581 may include two TJs 570, each formed by a portion of dielectric 508 "sandwiched" between an S/D electrode 504 and the island 512.

A gate structure 583 may be spaced apart from the S/D structure 581 on the substrate 502, and may include a gate electrode 506. During use, as discussed above with reference to FIG. 1, voltages may be applied to the gate electrode 506 and the S/D electrodes 504 to control electron transport and electron occupancy in the island 512; the gate electrode 506, the S/D electrodes 504, the dielectric 508, and the island 512 of FIG. 19 may thus provide a SET.

The dielectric 508 of FIG. 19 may extend up the sidewalls 574 of the S/D electrodes 504. In some embodiments, the dielectric 508 may extend along the substrate 502 between the S/D electrodes 504 such that a portion of the dielectric 508 is disposed between the island 512 and the substrate 502. The dielectric 508 may also extend up sidewalls 576 of the insulator 510, as shown.

The island 512 of FIG. 19 may be disposed at the bottom of the "box" formed by the dielectric 508. In some embodiments, the top face 578 of the island 512 may be recessed back from the top faces 582 of the S/D electrodes 504; in some such embodiments, a portion of the insulator 510 may be disposed in the "box" formed by the dielectric 508 such that the island 512 is disposed between this portion of the insulator 510 and the substrate 502.

Figure 19A:
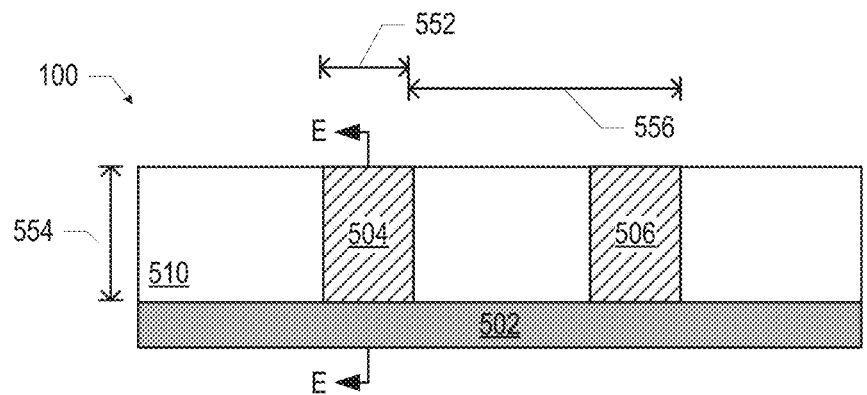
FIGS. 19A-19F are various views of another SET device, in accordance with various embodiments.
Figure 19B:
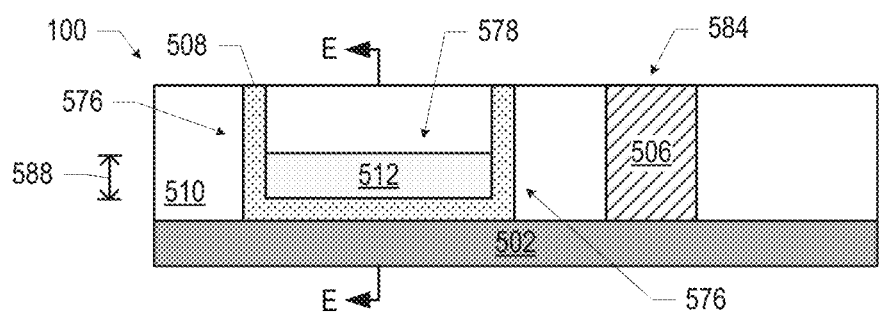
Figure 19C:
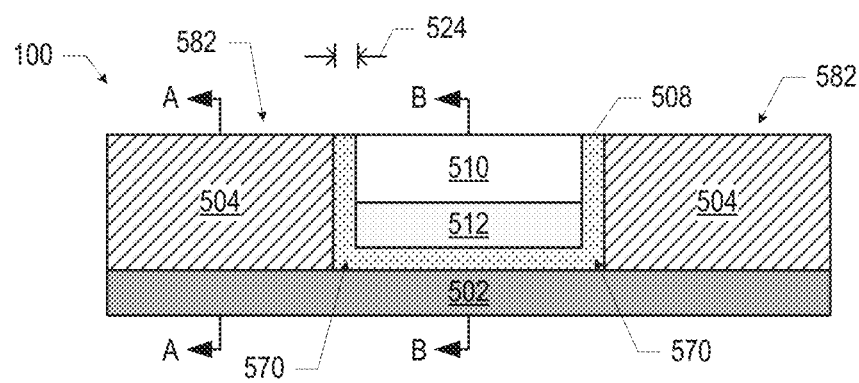
Figure 19D:
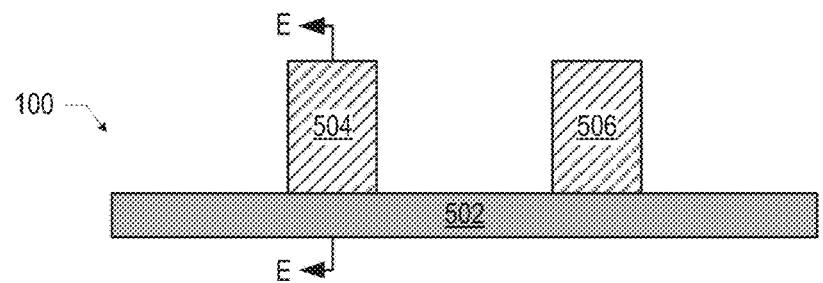
Figure 19E:
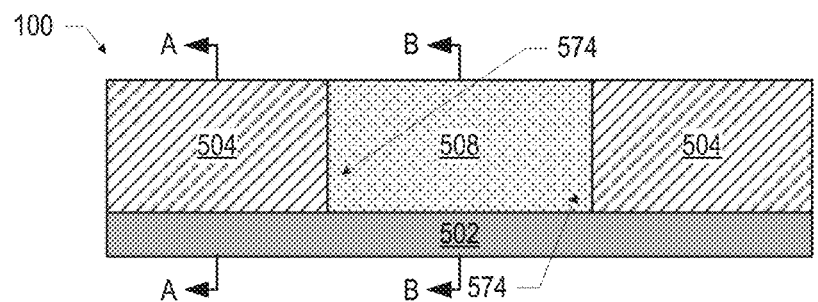
Figure 19F:
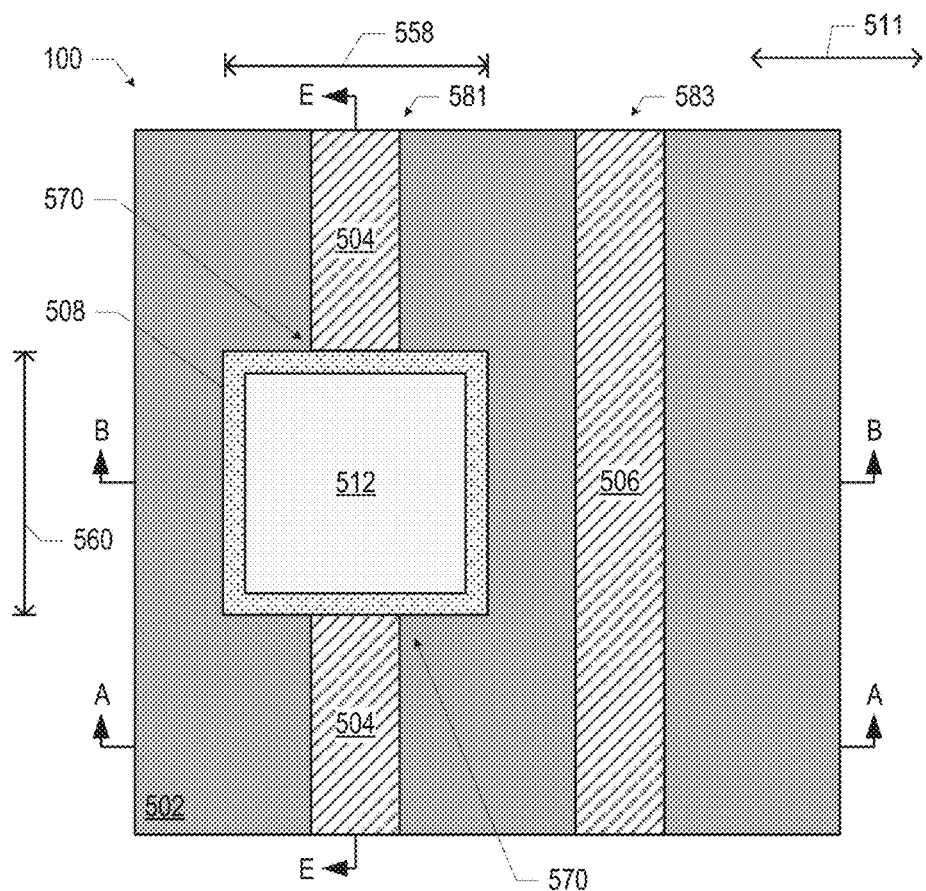

The width 552 and the height 554 of the S/D electrodes 504 may take any suitable values. For example, the width 552 may be between 20 and 80 nanometers (e.g., 40 nanometers), and the height 554 may be between 30 and 100 nanometers (e.g., 50 nanometers). The width and height of the gate electrode 506 may take the form of any of the embodiments of the width 552 and the height 554. In some embodiments, the spacing 556 of the S/D electrodes 504 and the gate electrode 506, as shown in FIG. 19A, may be between 80 and 200 nanometers (e.g., 100 nanometers). The dimensions 524 and 588 of FIG. 19 may take any of the forms discussed above with reference to the SET device 100 of FIG. 1.

As illustrated in FIG. 19, in some embodiments, the dielectric 508 may laterally extend beyond the area between the two S/D electrodes 504 (e.g., in the dimension indicated by the arrow 511). Similarly, in some embodiments, the island 512 may laterally extend beyond the area between the two S/D electrodes 504. In some embodiments, the dielectric 508 may have a lateral dimension 560 (parallel to the axis between the S/D electrodes 504) between 25 and 100 nanometers (e.g., 50 nanometers). In some embodiments, the dielectric 508 may have a lateral dimension 558 (perpendicular to the axis between the S/D electrodes 504) between 25 and 100 nanometers (e.g., 50 nanometers).

Any suitable materials discussed above with reference to the SET device 100 of FIG. 1 may be used in the SET device 100 of FIG. 19. Additionally, although a single complete SET device 100 is illustrated in FIG. 19, a device may include a one- or two-dimensional array of the SET devices 100 of FIG. 19 (or any other arrangement of multiple SET devices 100).

Figure 20A:
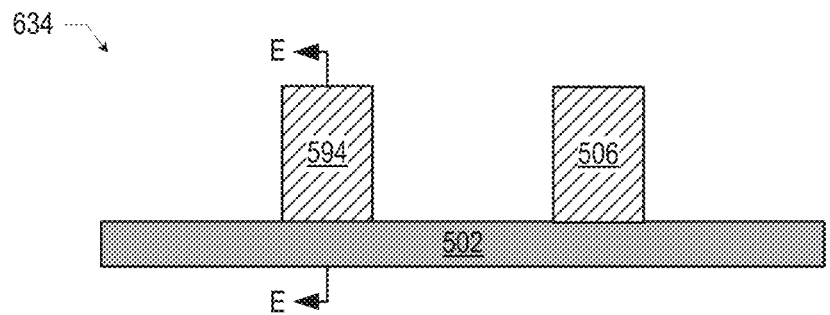
FIGS. 20A-20C, 21A-21C, and 22A-22C illustrate various example stages in the manufacture of the SET device of FIGS. 19A-19F, in accordance with various embodiments.
Figure 20B:
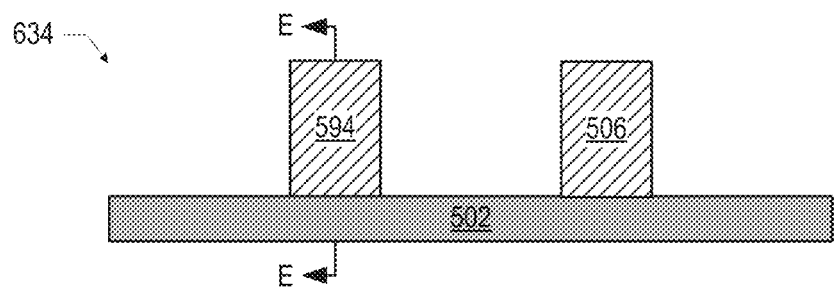
Figure 20C:
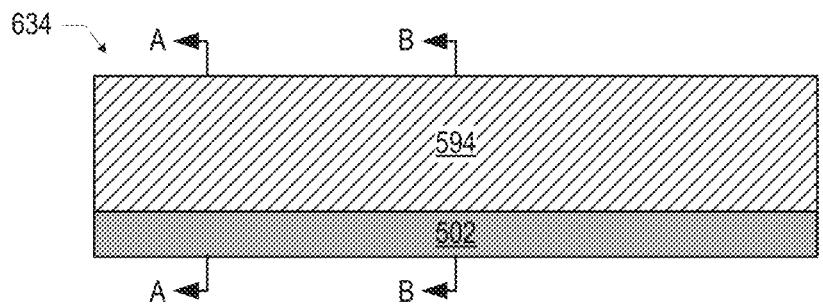
Figure 21A:
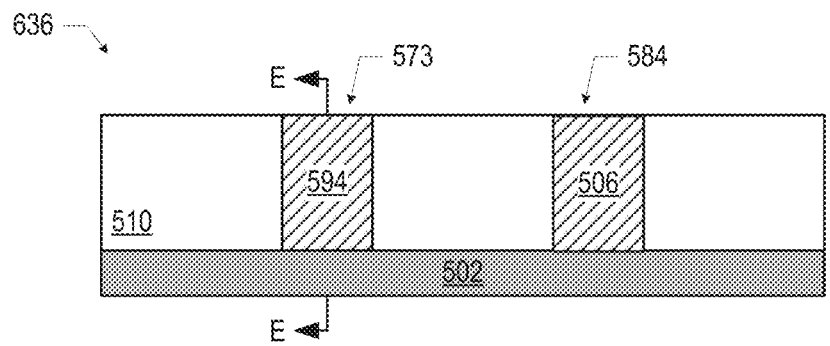
Figure 21B:
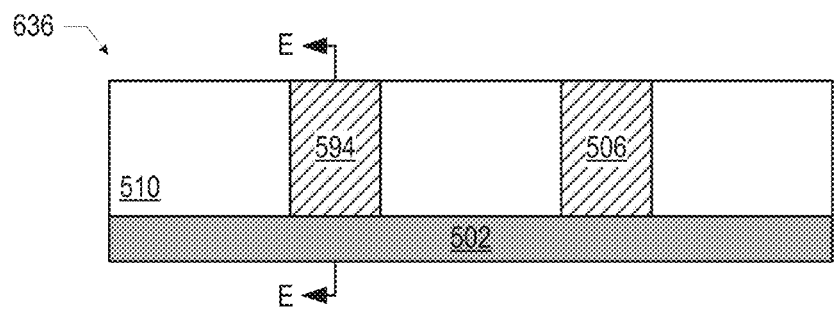
Figure 21C:
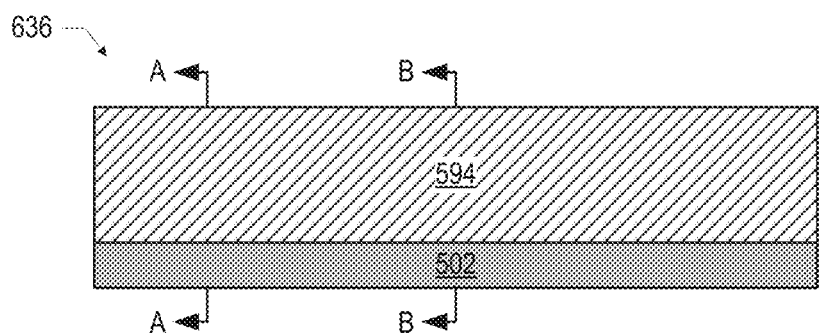
Figure 22A:
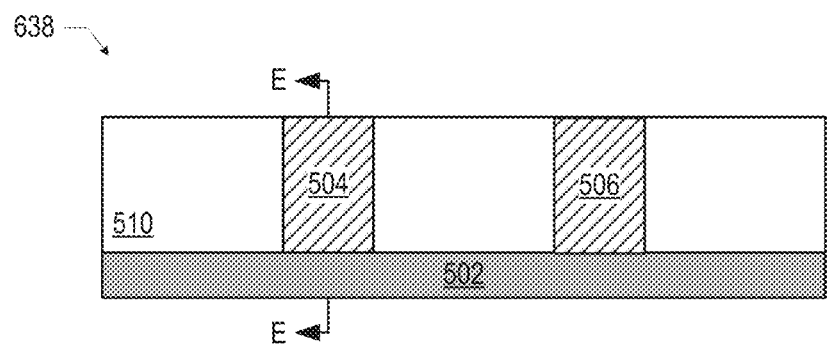
Figure 22B:
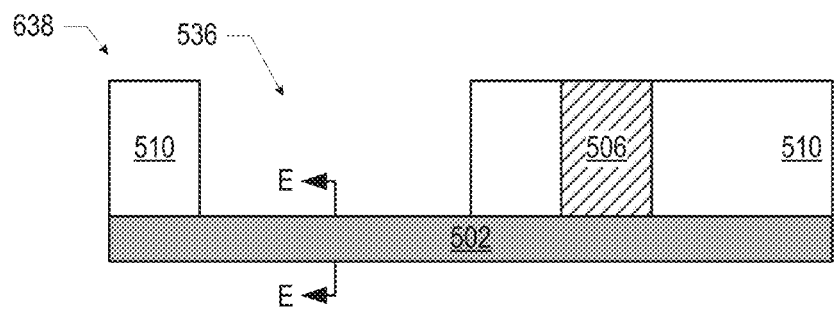
Figure 22C:
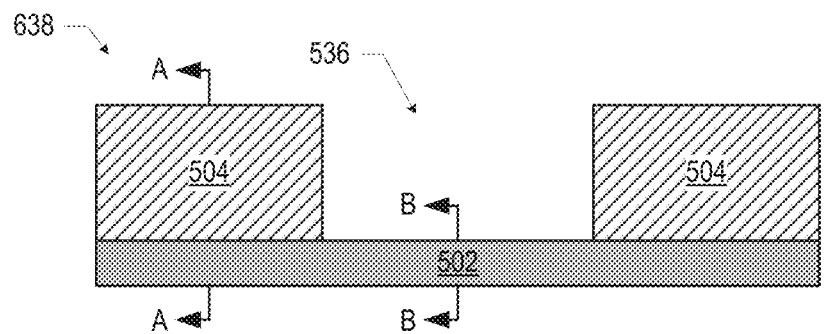
Figure 23A:
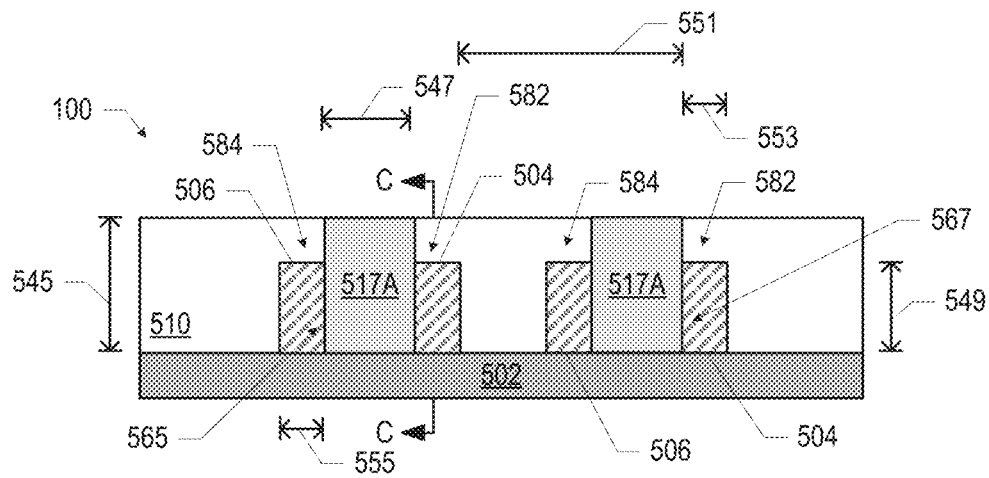
FIGS. 23A-23F are various views of another SET device, in accordance with various embodiments.
Figure 23B:
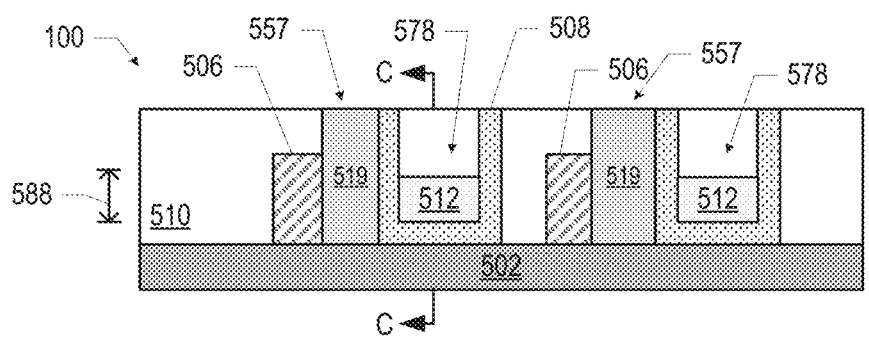
Figure 23C:
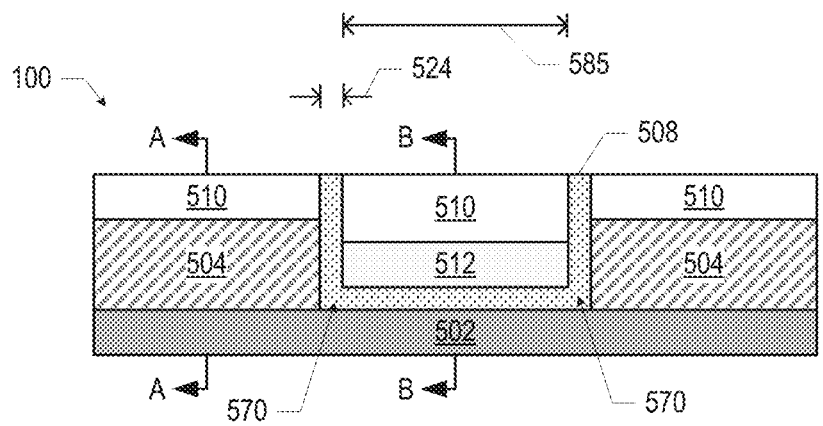
Figure 23D:
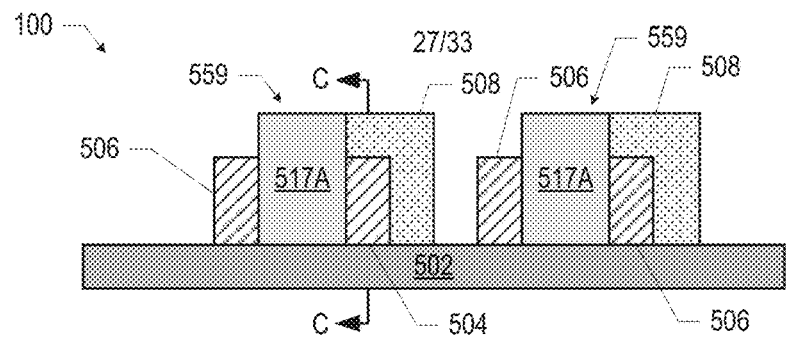
Figure 23E:
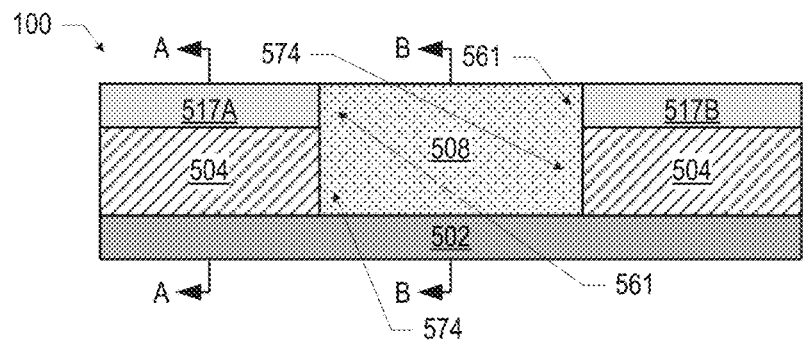
Figure 23F:
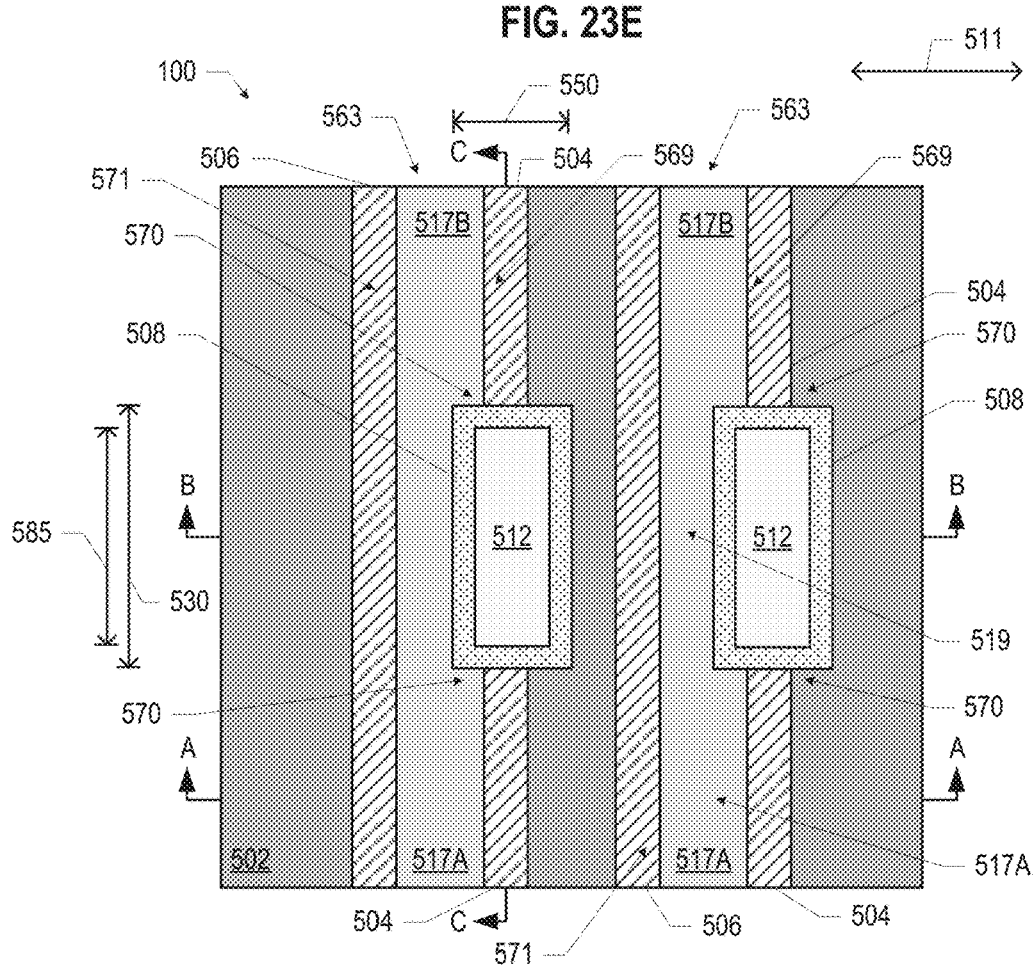

Any suitable process may be used to manufacture the SET device 100 of FIG. 19. For example, FIGS. 20-22 depict various cross-sectional views of stages in an example process for manufacturing the SET device 100 of FIG. 19. The materials and dimensions of various components of the stages illustrated in FIGS. 20-22 may take the form of any of the embodiments discussed herein. In FIGS. 20-22, the "A" sub-figures represent cross-sectional views through the section A-A (analogous to FIG. 19A), the "B" sub-figures represent cross-sectional views through the section B-B (analogous to FIG. 19B), and the "C" sub-figures represent cross-sectional views through the section E-E (analogous to FIG. 19C).

FIG. 20 depicts an assembly 634 subsequent to providing conductive material 594 and the gate electrode 506 on the substrate 502 of the assembly 602 (FIG. 2). In some embodiments, the conductive material 594 and the gate electrode 506 may each be shaped substantially as a rectangular solid. The conductive material 594 and the gate electrode 506 may each take the form of "fins" extending from the substrate 502, and may be formed using any suitable technique. For example, in some embodiments, a conductive material may be blanket-deposited on the substrate 502, and patterned to form the conductive material 594 and the gate electrode 506. In other embodiments, a sacrificial material may be blanket-deposited on the substrate 502, trenches may be formed in the sacrificial material down to the substrate 502, the trenches may be filled with conductive material to form the conductive material 594 and the gate electrode 506, and then the sacrificial material may be removed. These embodiments are simply examples, and any desired technique may be used to form the conductive material 594 and the gate electrode 506 on the substrate 502.

FIG. 21 depicts an assembly 636 subsequent to depositing an insulator 510 on the assembly 634 (FIG. 20). In the assembly 636, the top face 573 of the conductive material 594 and the top face 584 of the gate electrode 506 are shown as exposed, but in other embodiments, the insulator 510 may extend over the top face 573 and the top face 584. In some embodiments, deposition of the insulator 510 may be followed by a polishing step in which the insulator 510 is polished to create a flat face (e.g., by chemical mechanical polishing); in some such embodiments, the top face 573 and the top face 584 may be exposed subsequent to polishing.

FIG. 22 depicts an assembly 638 subsequent to forming a recess 536 in the assembly 636 (FIG. 21). The recess 536 may have the footprint of the dielectric 508 illustrated in FIG. 19F (e.g., a substantially rectangular footprint), and may divide the conductive material 594 of FIG. 21 into the two S/D electrodes 504. The lateral dimensions of the recess 536 may take any of the forms of the lateral dimensions 560 and 558 discussed herein. The recess 536 may be spaced apart from the gate electrode 506 by a portion of the insulator 510, as shown. The recess 536 may be formed using any of the techniques discussed above with reference to FIG. 8. The assembly 638 may be further processed as discussed above with reference to FIGS. 9-13 to form the SET device 100 illustrated in FIG. 19.

FIG. 23 provides various views of additional embodiments of a SET device 100. In particular, FIG. 23A is a cross-sectional view of the SET device 100 through the section A-A of FIGS. 23C, 23E, and 23F; FIG. 23B is a cross-sectional view of the SET device 100 through the section B-B of FIGS. 23C, 23E, and 23F; FIG. 23C is a cross-sectional view of the SET device 100 through the section C-C of FIGS. 23A, 23B, 23D, and 23F; FIG. 23D is a side view of the SET device 100 toward the section A-A with the insulator 510 removed; FIG. 23E is a side view of the SET device 100 toward the section C-C from the gate electrode 506 with the insulator 510 removed; and FIG. 23F is a top view of the SET device 100 with the insulator 510 removed. As discussed below, the SET device 100 of FIG. 23 may configured to so as to include two complete SETs (each provided by a gate/S/D structure 563), or one complete SET and two "halves" of additional SETs.

As illustrated in FIG. 23, the SET device 100 may include one or more gate/S/D structures 563, each including two supports 517A and 517B disposed on a substrate 502. A gate/S/D structure 563 may also include support material 519 between the supports 517A and 517B. In some embodiments, the supports 517A and 517B and the support material 519 may be materially contiguous (e.g., as discussed below with reference to FIG. 24). Reference to a "support 517" may refer to both the supports 517A and 517B. Two gate/S/D structures 563 are illustrated in FIG. 23, but any number of gate/S/D structures 563 may be included in a SET device 100. Each support 517 may have an S/D electrode 504 disposed on a side face 569 of the support 517. The two S/D electrodes 504 of a gate/S/D structure 563 may be spaced apart by intervening dielectric 508 and an island 512. In particular, a SET device 100 may include two TJs 570, each formed by a portion of dielectric 508 "sandwiched" between an S/D electrode 504 and the island 512. A gate/S/D structure 563 may also include a gate electrode 506 disposed on the side face 571 of the supports 517 and support material 519 (opposite to the side face 569).

The SET device 100 may be configured for use in a number of different ways. In some embodiments, the S/D electrodes 504, the island 512, and the dielectric 508 of one gate/S/D structure 563 may form a SET along with the proximate gate electrode 506 of a different adjacent gate/S/D structure 563. For example, in the embodiment shown in FIG. 23F, the "leftmost" S/D electrodes 504 and the "rightmost" gate electrode 506 (on different gate/S/D structures 563) may be used together as a SET, in any of the manners described above. In such embodiments, FIG. 23F may depict portions of additional SETs, accordingly; additional ones of the gate/S/D structures 563 may continue the linear array of FIG. 23F to provide as many complete SETs as desired. In other embodiments, the S/D electrodes 504, the island 512, the dielectric 508, and the gate electrode 506 in a single gate/S/D structure 563 may be used together as a SET. For example, in the embodiment shown in FIG. 23F, the "leftmost" S/D electrodes 504 and the "leftmost" gate electrode 506 (part of the same gate/S/D structure 563) may be used together as a SET; in such embodiments, FIG. 23F may depict two complete SETs. In either of these embodiments, an array of SETs may be formed (e.g., a one- or two-dimensional array, or any other arrangement of SETs).

The dielectric 508 of FIG. 23 may extend up the sidewalls 561 of the support 517, and up the sidewalls 574 of the S/D electrodes 504. In some embodiments, the dielectric 508 may extend along the substrate 502 between the S/D electrodes 504 such that a portion of the dielectric 508 is disposed between the islands 512 and the substrate 502. The dielectric 508 may also extend up sidewalls 576 of the insulator 510, as shown.

The island 512 of FIG. 23 may be disposed at the bottom of the "boxes" formed by the dielectric 508. In some embodiments, the top face 578 of the island 512 may be recessed back from the top face 559 of the support 517; in some such embodiments, a portion of the insulator 510 may be disposed in the "box" formed by the dielectric 508 such that the island 512 is disposed between this portion of the insulator 510 and the substrate 502.

In some embodiments, the top face 582 of the S/D electrodes 504 of FIG. 23 may be recessed back from the top face 559 of the support 517. Similarly, in some embodiments, the top face 584 of the gate electrode 506 may be recessed back from the top face 559 of the support 517. The dimensions 524, 588, 530, 550 and 585 of FIG. 23 may take any of the forms discussed above with reference to the SET device 100 of FIG. 1. The dimensions 549, 545, 547, 555, 553, and 551 may take any of the forms of the dimensions 526, 522, 518, 590, 520, and 587 disclosed herein.

As illustrated in FIG. 23, in some embodiments, the dielectric 508 may laterally extend beyond the area between the two S/D electrodes 504 of a gate/S/D structure 563 (e.g., in the dimension indicated by the arrow 511). Similarly, in some embodiments, the island 512 may laterally extend beyond the area between the two associated S/D electrodes 504.

Any suitable materials discussed above with reference to the SET device 100 of FIG. 1 may be used in the SET device 100 of FIG. 23. For example, the support 517 may be formed of any of the materials discussed above with reference to the S/D supports 514 and the gate supports 516.

Figure 24A:
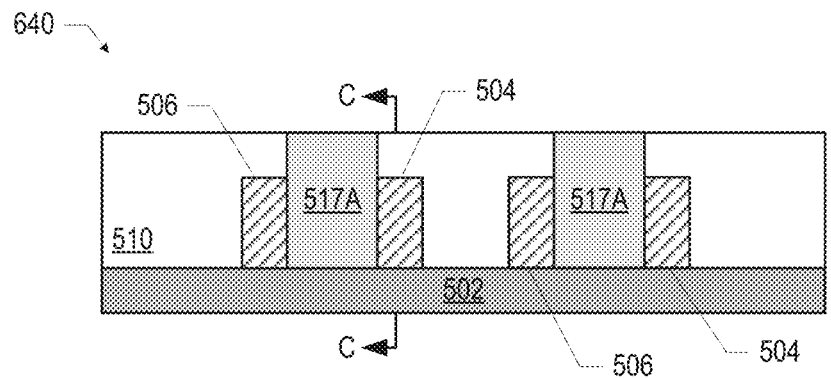
FIGS. 24A-24C illustrate an example stage in the manufacture of the SET device of FIGS. 23A-23F, in accordance with various embodiments.
Figure 24B:
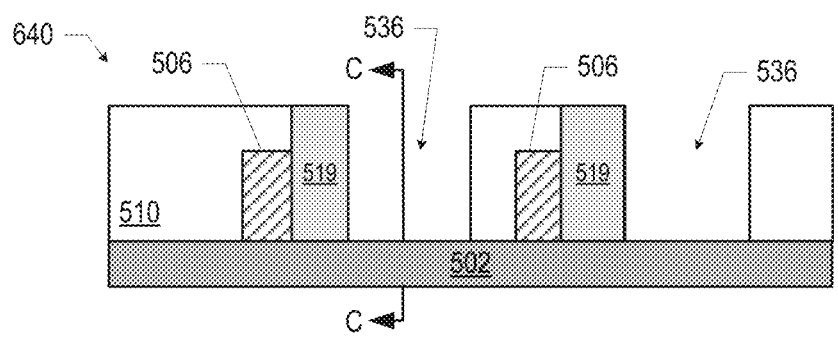
Figure 24C:
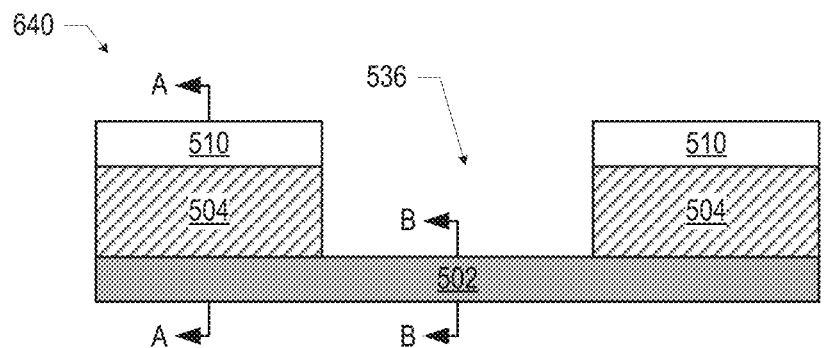

Any suitable process may be used to manufacture the SET device 100 of FIG. 23. For example, FIG. 24 depicts various cross-sectional views of a stage in an example process for manufacturing the SET device 100 of FIG. 23. The materials and dimensions of various components of the stage illustrated in FIG. 24 may take the form of any of the embodiments discussed herein. In FIG. 24, the "A" sub-figure represents a cross-sectional view through the section A-A (analogous to FIG. 23A), the "B" sub-figure represents a cross-sectional view through the section B-B (analogous to FIG. 23B), and the "C" sub-figure represents a cross-sectional view through the section C-C (analogous to FIG. 23C).

FIG. 24 depicts an assembly 640 subsequent to forming recesses 536 in the assembly 626 (FIG. 15). The recesses 536 may have the footprints of the dielectrics 508 illustrated in FIG. 23F (e.g., substantially rectangular footprints), and may divide the support material 592 of FIG. 15 into the two supports 517A and 517B, joined by the support material 519. The lateral dimensions of the recesses 536 may take any of the forms of the lateral dimensions 550 and 530 discussed herein. The recess 536 may divide the conductive material 534 into two S/D electrodes 504 (disposed on the side faces 569 of the supports 517). In FIG. 24, the conductive material 596 is relabeled as the gate electrode 506, and the gate support 516 has been relabeled as the support 517, consistent with FIG. 23. The recess 536 may be spaced apart from the gate electrode 506 by the support material 519, as shown, and a recess 536 of one gate/S/D structure 563 (not labeled in FIG. 24) may be spaced apart by a proximate gate electrode 506 of another gate/S/D structure 563 by a portion of the insulator 510, as shown. The recesses 536 may be formed using any of the techniques discussed above with reference to FIG. 8. The assembly 640 may be further processed as discussed above with reference to FIGS. 17-18 and/or 9-13 to form the SET device 100 illustrated in FIG. 23.

Figure 25:
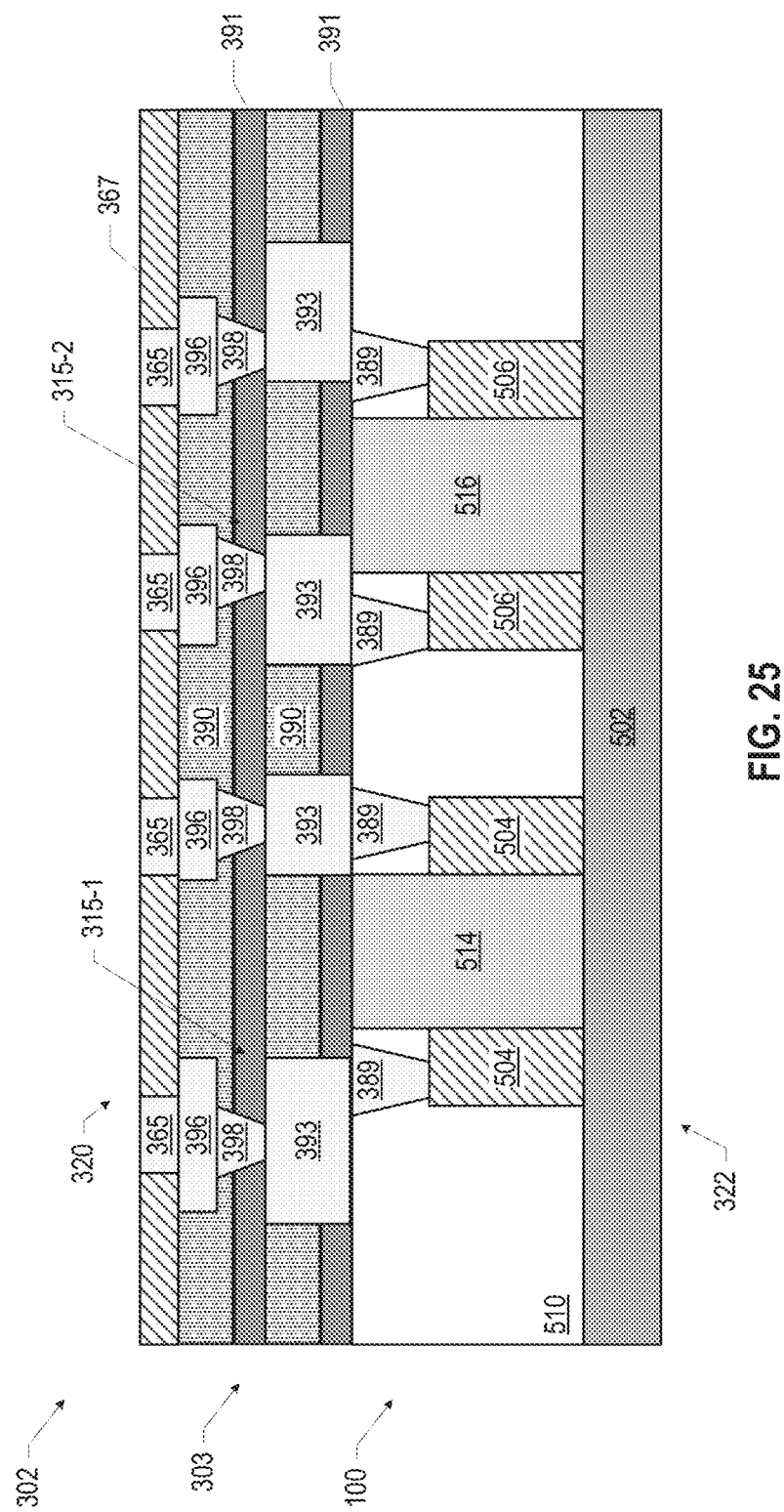
FIG. 25 is a cross-sectional view of a die including a SET device, in accordance with various embodiments.
Figure 26:
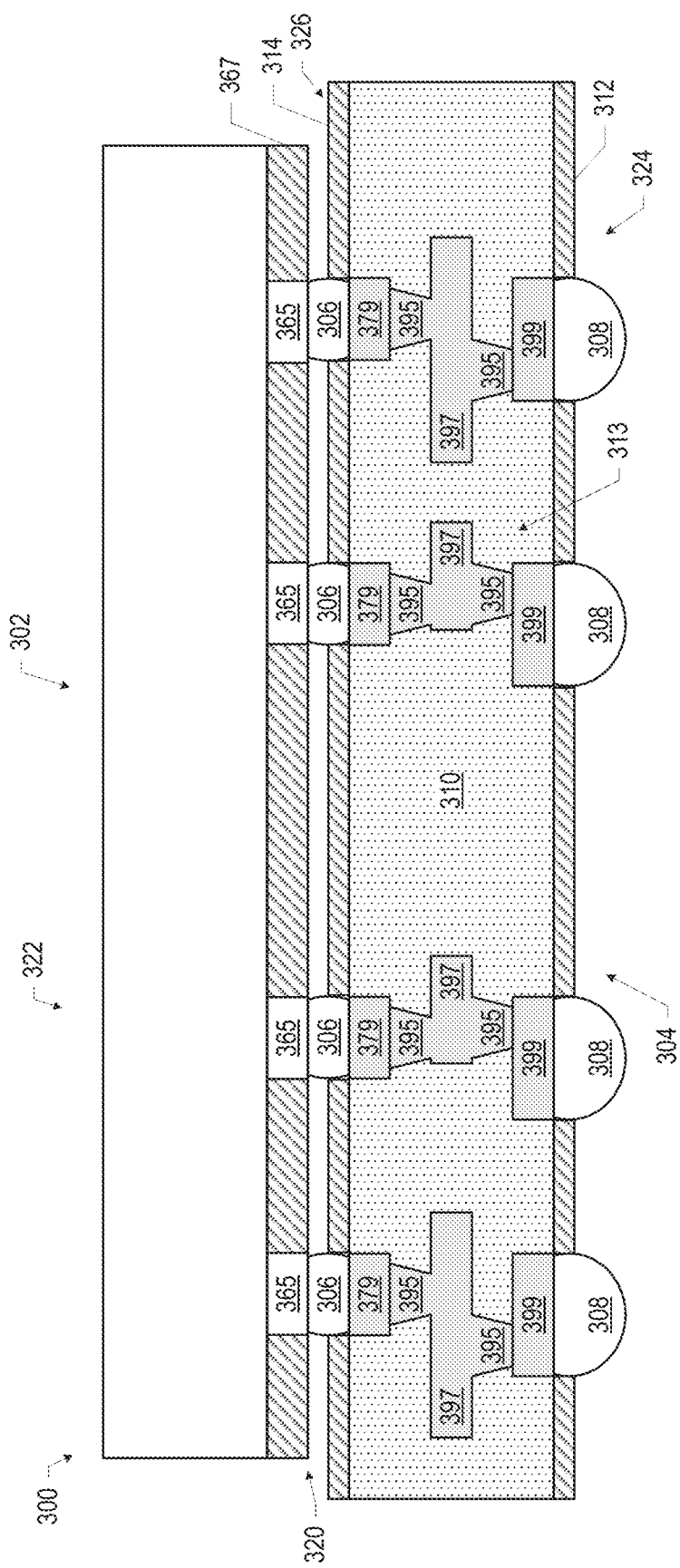
FIG. 26 is a cross-sectional view of a SET device package, in accordance with various embodiments.

In some embodiments, the SET device 100 may be included in a die and coupled to a package substrate to form a SET device package. For example, FIG. 25 is a side cross-sectional view of a die 302 including the SET device 100 of FIG. 14A and conductive pathway layers 303 disposed thereon, while FIG. 26 is a side cross-sectional view of a SET device package 300 in which the die 302 is coupled to a package substrate 304. As noted above, the particular SET device 100 illustrated in FIG. 26 may take the form of the SET device 100 illustrated in FIG. 14A, but any of the SET devices 100 disclosed herein (e.g., the SET devices 100 discussed above with reference to FIG. 1, FIG. 19, or FIG. 23) may be included in a die (e.g., the die 302) and coupled to a package substrate (e.g., the package substrate 304). Additionally, although only a single SET device 100 is illustrated in FIG. 25, this is simply for economy of illustration, and any desired number of SET devices 100 may be included in a die 302 (e.g., in an array, as discussed above).

The die 302 may include a first face 320 and an opposing second face 322. The substrate 502 may be proximate to the second face 322, and conductive pathways 315 from various components of the SET device 100 may extend to conductive contacts 365 disposed at the first face 320. The conductive pathways 315 may include conductive vias, conductive lines, and/or any combination of conductive vias and lines. For example, FIG. 25 illustrates an embodiment in which a conductive pathway 315-1 (extending between an S/D electrode 504 and an associated conductive contact 365) includes a conductive via 389, a conductive line 393, a conductive via 398, and a conductive line 396. In the embodiment of FIG. 25, another conductive pathway 315-2 (extending between a gate electrode 506 and an associated conductive contact 365) includes a conductive via 389, a conductive line 393, a conductive via 398, and a conductive line 396. More or fewer structures may be included in the conductive pathways 315, and analogous conductive pathways 315 may be provided between ones of the conductive contacts 365 and any components of the SET device 100. In some embodiments, conductive lines of the die 302 (and the package substrate 304, discussed below) may extend into and out of the plane of the drawing, providing conductive pathways to route electrical signals to and/or from various elements in the die 302.

The conductive vias and/or lines that provide the conductive pathways 315 in the die 302 may be formed using any suitable techniques. Examples of such techniques may include subtractive fabrication techniques, additive or semi-additive fabrication techniques, single Damascene fabrication techniques, dual Damascene fabrication techniques, or any other suitable technique. In some embodiments, layers of oxide material 390 and layers of nitride material 391 may insulate various structures in the conductive pathways 315 from proximate structures, and/or may serve as etch stops during fabrication. In some embodiments, an adhesion layer (not shown) may be disposed between conductive material and proximate insulating material of the die 302 to improve mechanical adhesion between the conductive material and the insulating material. Although FIG. 25 illustrates a layer of nitride material 391 disposed directly on the S/D support 514 and the gate support 516 of the SET device 100, this need not be the case, and in some embodiments, additional insulator 510 may be disposed between the S/D support 514 (and the gate support 516) and the first layer of nitride material 391.

The S/D electrodes 504 and the gate electrodes 506 (as well as the proximate conductive vias/lines, such as the conductive vias 389) may be referred to as part of the "device layer" of the SET device 100. The conductive lines 393 may be referred to as a Metal 1 or "M1" interconnect layer, and may couple the structures in the device layer to other interconnect structures. The conductive vias 398 and the conductive lines 396 may be referred to as a Metal 2 or "M2" interconnect layer, and may be formed directly on the M1 interconnect layer. More or fewer interconnect layers may be included in the die 302, as desired.

A solder resist material 367 may be disposed around the conductive contacts 365, and in some embodiments may extend onto the conductive contacts 365. The solder resist material 367 may be a polyimide or similar material, or may be any appropriate type of packaging solder resist material.

In some embodiments, the solder resist material 367 may be a liquid or dry film material including photoimageable polymers. In some embodiments, the solder resist material 367 may be non-photoimageable (and openings therein may be formed using laser drilling or masked etch techniques). The conductive contacts 365 may provide the contacts to couple other components (e.g., a package substrate 304, as discussed below, or another component) to the conductive pathways 315 in the SET device 100, and may be formed of any suitable conductive material (e.g., a superconducting material). For example, solder bonds may be formed on the one or more conductive contacts 365 to mechanically and/or electrically couple the die 302 with another component (e.g., a circuit board), as discussed below. The conductive contacts 365 illustrated in FIG. 25 take the form of bond pads, but other first level interconnect structures may be used (e.g., posts) to route electrical signals to/from the die 302, as discussed below.

The combination of the conductive pathways and the proximate insulating material (e.g., the proximate insulator 510, the oxide material 390, and the nitride material 391) in the die 302 may provide an interlayer dielectric (ILD) stack of the die 302. As noted above, interconnect structures may be arranged within the SET device 100 to route electrical signals according to a wide variety of designs (in particular, the arrangement is not limited to the particular configuration of interconnect structures depicted in FIG. 25 or any of the other accompanying figures, and may include more or fewer interconnect structures). During operation of the SET device 100, electrical signals (such as power and/or input/output (I/O) signals) may be routed to and/or from the S/D electrodes 504 and the gate electrodes 506 (and/or other components) of the SET device 100 through the interconnects provided by conductive vias and/or lines, and through the conductive pathways of the package substrate 304 (discussed below).

In the SET device package 300 (FIG. 26), first level interconnects 306 may be disposed between the first face 320 of the die 302 and the second face 326 of a package substrate 304. Having first level interconnects 306 disposed between the first face 320 of the die 302 and the second face 326 of the package substrate 304 (e.g., using solder bumps as part of flip chip packaging techniques) may enable the SET device package 300 to achieve a smaller footprint and higher die-to-package-substrate connection density than could be achieved using conventional wirebond techniques (in which conductive contacts between the die 302 and the package substrate 304 are constrained to be located on the periphery of the die 302). For example, a die 302 having a square first face 320 with side length N may be able to form only 4N wirebond interconnects to the package substrate 304, versus $N^2$ flip chip interconnects (utilizing the entire "full field" face area of the first face 320). Additionally, in some applications, wirebond interconnects may generate unacceptable amounts of heat that may damage or otherwise interfere with the performance of the SET device 100. Using solder bumps as the first level interconnects 306 may enable the SET device package 300 to have much lower parasitic inductance relative to using wirebonds to couple the die 302 and the package substrate 304, which may result in an improvement in signal integrity for high-speed signals communicated between the die 302 and the package substrate 304.

The package substrate 304 may include a first face 324 and an opposing second face 326. Conductive contacts 399 may be disposed at the first face 324, and conductive contacts 379 may be disposed at the second face 326. Solder resist material 314 may be disposed around the conductive contacts 379, and solder resist material 312 may be disposed around the conductive contacts 399; the solder resist materials 314 and 312 may take any of the forms discussed above with reference to the solder resist material 367. In some embodiments, the solder resist material 312 and/or the solder resist material 314 may be omitted. Conductive pathways 313 may extend through insulating material 310 between the first face 324 and the second face 326 of the package substrate 304, electrically coupling various ones of the conductive contacts 399 to various ones of the conductive contacts 379, in any desired manner. The insulating material 310 may be a dielectric material (e.g., an ILD), and may take the form of any of the embodiments of the insulator 510 disclosed herein, for example. The conductive pathways 313 may include one or more conductive vias 395 and/or one or more conductive lines 397, for example.

In some embodiments, the SET device package 300 may be a cored package, one in which the package substrate 304 is built on a carrier material (not shown) that remains in the package substrate 304. In such embodiments, the carrier material may be a dielectric material that is part of the insulating material 310; laser vias or other through-holes may be made through the carrier material to allow conductive pathways 313 to extend between the first face 324 and the second face 326.

In some embodiments, the package substrate 304 may be or may otherwise include a silicon interposer, and the conductive pathways 313 may be through-silicon vias. Silicon may have a desirably low coefficient of thermal expansion compared with other dielectric materials that may be used for the insulating material 310, and thus may limit the degree to which the package substrate 304 expands and contracts during temperature changes relative to such other materials (e.g., polymers having higher coefficients of thermal expansion). A silicon interposer may also help the package substrate 304 achieve a desirably small line width and maintain high connection density to the die 302.

Limiting differential expansion and contraction may help preserve the mechanical and electrical integrity of the SET device package 300 as the SET device package 300 is fabricated (and exposed to higher temperatures) and used in a cooled environment (and exposed to lower temperatures). In some embodiments, thermal expansion and contraction in the package substrate 304 may be managed by maintaining an approximately uniform density of the conductive material in the package substrate 304 (so that different portions of the package substrate 304 expand and contract uniformly), using reinforced dielectric materials as the insulating material 310 (e.g., dielectric materials with silicon dioxide fillers), or utilizing stiffer materials as the insulating material 310 (e.g., a prepreg material including glass cloth fibers).

The conductive contacts 365 of the die 302 may be electrically coupled to the conductive contacts 379 of the package substrate 304 via the first level interconnects 306. In some embodiments, the first level interconnects 306 may include solder bumps or balls (as illustrated in FIG. 26); for example, the first level interconnects 306 may be flip chip (or controlled collapse chip connection, "C4") bumps disposed initially on the die 302 or on the package substrate 304. Second level interconnects 308 (e.g., solder balls or other types of interconnects) may couple the conductive contacts 399 on the first face 324 of the package substrate 304 to another component, such as a circuit board (not shown). Examples of arrangements of electronics packages that may include an embodiment of the SET device package 300 are discussed below with reference to FIG. 28. The die 302 may be brought in contact with the package substrate 304 using a pick-and-place apparatus, for example, and a reflow or thermal compression bonding operation may be used to couple the die 302 to the package substrate 304 via the first level interconnects 306.

The conductive contacts 365, 379, and/or 399 may include multiple layers of material that may be selected to serve different purposes. In some embodiments, the conductive contacts 365, 379, and/or 399 may be formed of aluminum, and may include a layer of gold (e.g., with a thickness of less than 1 micron) between the aluminum and the adjacent interconnect to limit the oxidation of the surface of the contacts and improve the adhesion with adjacent solder. In some embodiments, the conductive contacts 365, 379, and/or 399 may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect. In such embodiments, the gold may protect the barrier metal face from oxidation before assembly, and the barrier metal may limit the diffusion of solder from the adjacent interconnects into the aluminum.

In some embodiments, the structures and materials in the SET device 100 may be damaged if the SET device 100 is exposed to the high temperatures that are common in conventional integrated circuit processing (e.g., greater than 100 degrees Celsius, or greater than 200 degrees Celsius). In particular, in embodiments in which the first level interconnects 306 include solder, the solder may be a low-temperature solder (e.g., a solder having a melting point below 100 degrees Celsius) so that it can be melted to couple the conductive contacts 365 and the conductive contacts 379 without having to expose the die 302 to higher temperatures and risk damaging the SET device 100. Examples of solders that may be suitable include indium-based solders (e.g., solders including indium alloys). When low-temperature solders are used, however, these solders may not be fully solid during handling of the SET device package 300 (e.g., at room temperature or temperatures between room temperature and 100 degrees Celsius), and thus the solder of the first level interconnects 306 alone may not reliably mechanically couple the die 302 and the package substrate 304 (and thus may not reliably electrically couple the die 302 and the package substrate 304). In some such embodiments, the SET device package 300 may further include a mechanical stabilizer to maintain mechanical coupling between the die 302 and the package substrate 304, even when solder of the first level interconnects 306 is not solid. Examples of mechanical stabilizers may include an underfill material disposed between the die 302 and the package substrate 304, a corner glue disposed between the die 302 and the package substrate 304, an overmold material disposed around the die 302 on the package substrate 304, and/or a mechanical frame to secure the die 302 and the package substrate 304.

In some embodiments, various conductive components of the die 302 and/or the SET device package 300 may be formed of superconducting materials. Example superconducting materials that may be used for the structures in the conductive pathways 313 and 315, and/or conductive contacts of the die 302 and/or the package substrate 304, may include aluminum, niobium, tin, titanium, osmium, zinc, molybdenum, tantalum, vanadium, or composites of such materials (e.g., niobium-titanium, niobium-aluminum, or niobium-tin). In some embodiments, the conductive contacts 365, 379, and/or 399 may include aluminum, and the first level interconnects 306 and/or the second level interconnects 308 may include an indium-based solder.

FIGS. 27A-B are top views of a wafer 450 and dies 452 that may be formed from the wafer 450; the dies 452 may be included in any of the SET device packages (e.g., the SET device package 300) disclosed herein. The wafer 450 may include semiconductor material and may include one or more dies 452 having conventional and SET device elements formed on a face of the wafer 450. Each of the dies 452 may be a repeating unit of a semiconductor product that includes any suitable conventional transistor and/or SET device. After the fabrication of the semiconductor product is complete, the wafer 450 may undergo a singulation process in which each of the dies 452 is separated from one another to provide discrete "chips" of the semiconductor product. A die 452 may include one or more SET devices 100 and/or supporting circuitry to route electrical signals to the SET devices 100 (e.g., interconnects including conductive vias and lines), as well as any other IC components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 32) or other logic that is configured to store information in the memory devices or execute instructions stored in the memory array.

FIG. 28 is a cross-sectional side view of a device assembly 400 that may include any of the embodiments of the SET device packages 300 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 28 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 26), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. For example, the coupling components 418 may be the second level interconnects 308. Although a single package 420 is shown in FIG. 28, multiple packages may be coupled to the interposer 404; indeed, additional interposers may be coupled to the interposer 404. The interposer 404 may provide an intervening substrate used to bridge the circuit board 402 and the package 420. The package 420 may be a SET device package 300 or may be a conventional IC package, for example. In some embodiments, the package 420 may take the form of any of the embodiments of the SET device package 300 disclosed herein, and may include a SET device die 302 coupled to a package substrate 304 (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 28, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may be a SET device package 300 or may be a conventional IC package, for example. In some embodiments, the package 424 may take the form of any of the embodiments of the SET device package 300 disclosed herein, and may include a SET device die 302 coupled to a package substrate 304 (e.g., by flip chip connections).

The device assembly 400 illustrated in FIG. 28 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may be a SET device package 300 or may be a conventional IC package, for example. In some embodiments, one or both of the packages 426 and 432 may take the form of any of the embodiments of the SET device package 300 disclosed herein, and may include a die 302 coupled to a package substrate 304 (e.g., by flip chip connections).

As noted above, any suitable techniques may be used to manufacture the SET devices 100 disclosed herein. FIGS. 29 and 30 are flow diagrams of illustrative methods 1000 and 1020, respectively, of manufacturing a SET device, in accordance with various embodiments. Although the operations discussed below with reference to the methods 1000 and 1020 are illustrated in a particular order and depicted once each, these operations may be repeated or performed in a different order (e.g., in parallel), as suitable. Additionally, various operations may be omitted, as suitable. Various operations of the methods 1000 and 1020 may be illustrated with reference to one or more of the embodiments discussed above, but the methods 1000 and 1020 may be used to manufacture any suitable SET device (including any suitable ones of the embodiments disclosed herein).

Turning to FIG. 29, at 1002, an insulating support may be formed. For example, support material 592 may be formed (e.g., as discussed above with reference to FIG. 3).

At 1004, a conductive material may be provided on at least one side face of the insulating support. For example, conductive material 534 may be provided on the support material 592 (e.g., as discussed above with reference to FIGS. 4-6 and 15).

At 1006, an insulating material may be provided on the conductive material and the insulating support to form a first assembly. For example, an insulator 510 may be provided on the conductive material 534 and the support material 592 (e.g., as discussed above with reference to FIGS. 7 and 15).

At 1008, a recess may be formed in the first assembly. The recess may extend into the insulating support and may separate the conductive material into at least first and second separate conductive portions. For example, one or more recesses 536 may be formed (e.g., as discussed above with reference to FIGS. 8, 16, and 24)

At 1010, a dielectric may be provided on the sidewalls and bottom of the recess. For example, the dielectric material 593 may be provided on the sidewalls and bottom of the one or more recesses 536 (e.g., as discussed above with reference to FIGS. 9 and 17).

At 1012, an island material may be provided in the recess on the dielectric. For example, the island material 538 may be provided in the one or more recesses 536 (e.g., as discussed above with reference to FIGS. 10 and 18).

Turning to FIG. 30, at 1022, a fin may be formed of conductive material. The fin may extend away from a substrate. For example, the S/D electrode 504 may be formed on a substrate 502, as discussed above with reference to FIG. 20.

At 1024, an insulating material may be provided on the fin to form a first assembly. For example, an insulator 510 may be provided on the S/D electrode 504, as discussed above with reference to FIG. 21.

At 1026, a recess may be formed in the first assembly. The recess may extend into the fin and separate the fin into at least first and second separate conductive portions. For example, a recess 536 may be formed, as discussed above with reference to FIG. 22.

At 1028, a dielectric may be provided on the sidewalls and bottom of the recess. For example, the dielectric material 593 may be provided on the sidewalls and bottom of the recess 536, as discussed above with reference to FIG. 9.

At 1030, an island material may be provided in the recess on the dielectric. For example, the island material 538 may be provided in the recess 536, as discussed above with reference to FIG. 10.

A number of techniques are disclosed herein for operating a SET device 100. FIG. 31 is a flow diagram of a particular illustrative method 1040 of operating a SET device, in accordance with various embodiments. Although the operations discussed below with reference to the method 1040 are illustrated in a particular order and depicted once each, these operations may be repeated or performed in a different order (e.g., in parallel), as suitable. Additionally, various operations may be omitted, as suitable. Various operations of the method 1040 may be illustrated with reference to one or more of the embodiments discussed above, but the method 1040 may be used to operate any suitable SET device (including any suitable ones of the embodiments disclosed herein).

At 1042, a voltage may be controlled between a drain electrode and a source electrode of a SET device. The SET device may take the form of any of the SET devices disclosed herein (e.g., discussed with reference to FIG. 1, 14, 19, or 23). For example, a voltage may be controlled between two S/D electrodes 504 of a SET device 100.

At 1044, a voltage may be controlled between a gate electrode and an island of a SET device. For example, a voltage may be controlled between a gate electrode 506 and an island 512 of a SET device 100.

Figure 32:
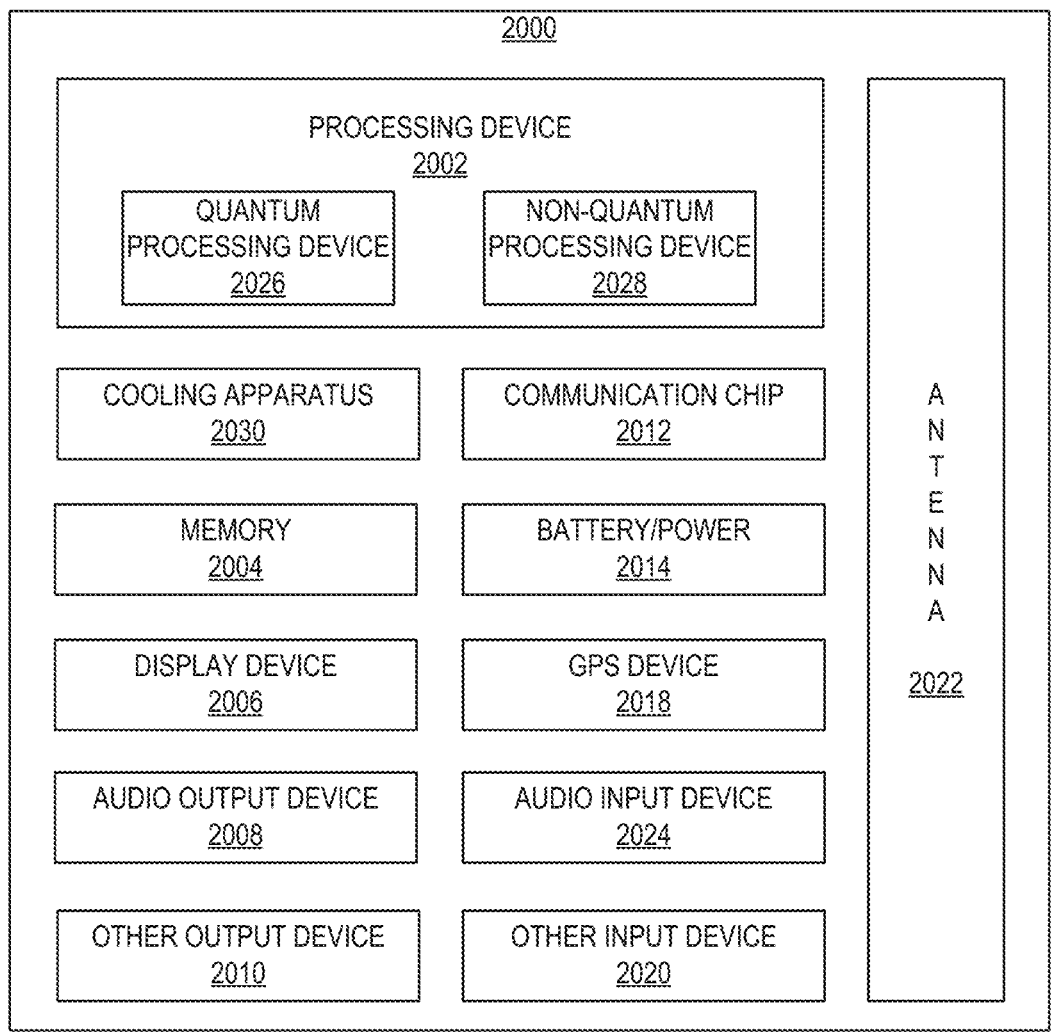
FIG. 32 is a block diagram of an example computing device that may include any of the SET devices disclosed herein, in accordance with various embodiments.

FIG. 32 is a block diagram of an example computing device 2000 that may include any of the SET devices disclosed herein. A number of components are illustrated in FIG. 32 as included in the computing device 2000, but any one or more of these components may be omitted or duplicated, as suitable for the application. In some embodiments, some or all of the components included in the computing device 2000 may be attached to one or more printed circuit boards (e.g., a motherboard). In some embodiments, various ones of these components may be fabricated onto a single system-on-a-chip (SoC) die. Additionally, in various embodiments, the computing device 2000 may not include one or more of the components illustrated in FIG. 32, but the computing device 2000 may include interface circuitry for coupling to the one or more components. For example, the computing device 2000 may not include a display device 2006, but may include display device interface circuitry (e.g., a connector and driver circuitry) to which a display device 2006 may be coupled. In another set of examples, the computing device 2000 may not include an audio input device 2024 or an audio output device 2008, but may include audio input or output device interface circuitry (e.g., connectors and supporting circuitry) to which an audio input device 2024 or audio output device 2008 may be coupled.

The computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. In some embodiments, the processing device 2002 may include one or more SET devices 100 (in accordance with any of the embodiments disclosed herein), one or more conventional FETs or other transistors, or any desired combination of SET devices 100 and FETs (or other transistors).

In some embodiments, the processing device 2002 may include a quantum processing device 2026 (e.g., one or more quantum processing devices), and a non-quantum processing device 2028 (e.g., one or more non-quantum processing devices). The quantum processing device 2026 may include one or more qubit devices (e.g., spin-based quantum dot devices) and one or more SET devices 100 (in accordance with any of the embodiments disclosed herein) arranged to detect the state of the qubit devices. In some embodiments, the quantum processing device 2026 may perform data processing by performing operations on the qubits that may be detected by the SET devices 100, and may monitor the result of those operations. For example, different qubits may be allowed to interact, the quantum states of different qubits may be set or transformed, and the quantum states of qubits may be read (e.g., by a SET device 100). In some embodiments, the qubits themselves may be provided by SET devices 100, as discussed above. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters. In some embodiments, the processing device 2002 may not include a quantum processing device 2026.

As noted above, the processing device 2002 may include a non-quantum processing device 2028. In some embodiments in which the processing device 2002 includes a quantum processing device 2026, the non-quantum processing device 2028 may provide peripheral logic to support the operation of the quantum processing device 2026. For example, the non-quantum processing device 2028 may control the performance of a read operation, control the performance of a write operation, control the clearing of qubits, etc. The non-quantum processing device 2028 may also perform conventional computing functions (e.g., to supplement the computing functions provided by the quantum processing device 2026). For example, the non-quantum processing device 2028 may interface with one or more of the other components of the computing device 2000 (e.g., the communication chip 2012 discussed below, the display device 2006 discussed below, etc.) in a conventional manner, and may serve as an interface between the quantum processing device 2026 and conventional components. In some embodiments in which the processing device 2002 does not include a quantum processing device 2026, the non-quantum processing device 2028 (which may include any of the SET devices 100 disclosed herein) may perform any known computing function. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-M RAM).

In some embodiments, the computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. The cooling apparatus 2030 may be, for example, a dilution refrigerator, a helium-3 refrigerator, or a liquid helium refrigerator. In some embodiments, the non-quantum processing device 2028 (and various other components of the computing device 2000) may not be cooled by the cooling apparatus 2030, and may instead operate at room temperature. For example, any of the SET devices 100 disclosed herein may be operated at liquid nitrogen temperature (approximately 77 degrees Kelvin). The SET devices 100 disclosed herein may be operated at or close to room temperature if the dimensions of the SET device 100 are suitable for operation in such temperature ranges. Operation of a SET 100 at a particular temperature may be suitable, for example, when the charging energy of the SET 100 is at least three times larger than the energy of the thermal bath in which the SET 100 operates. In some embodiments, the computing device 2000 may not include a cooling apparatus 2030.

In some embodiments, the computing device 2000 may include a communication chip 2012 (e.g., one or more communication chips). For example, the communication chip 2012 may be configured for managing wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The computing device 2000 may include battery/power circuitry 2014. The battery/power circuitry 2014 may include one or more energy storage devices (e.g., batteries or capacitors) and/or circuitry for coupling components of the computing device 2000 to an energy source separate from the computing device 2000 (e.g., AC line power).

The computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The computing device 2000 may include an audio output device 2008 (or corresponding interface circuitry, as discussed above). The audio output device 2008 may include any device that generates an audible indicator, such as speakers, headsets, or earbuds, for example.

The computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The computing device 2000 may include a global positioning system (GPS) device 2018 (or corresponding interface circuitry, as discussed above). The GPS device 2018 may be in communication with a satellite-based system and may receive a location of the computing device 2000, as known in the art.

The computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a device, including: first and second insulating supports; first and second source/drain (S/D) electrodes of a single electron transistor (SET), wherein the first S/D electrode is disposed on a side face of the first insulating support and the second S/D electrode is disposed on a side face of the second insulating support; an island of the SET, disposed between the first and second S/D electrodes and extending into an area between the first and second insulating supports; and first and second portions of a dielectric, wherein the first portion of the dielectric is disposed between the first S/D electrode and the island, and the second portion of the dielectric is disposed between the second S/D electrode and the island, to provide first and second tunnel junctions (TJs), respectively.

Example 2 may include the subject matter of Example 1, and may further specify that a height of the island is less than a height of the first S/D electrode.

Example 3 may include the subject matter of any of Examples 1-2, and may further specify that the first and second S/D electrodes are disposed on a substrate, and another portion of the dielectric is disposed between the substrate and the island.

Example 4 may include the subject matter of any of Examples 1-3, and may further specify that the first and second portions of the dielectric have a thickness between 0.5 and 5 nanometers.

Example 5 may include the subject matter of any of Examples 1-4, and may further specify that the first and second S/D electrodes have a thickness, measured from the side faces of the first and second insulating supports, respectively, between 1 and 10 nanometers.

Example 6 may include the subject matter of any of Examples 1-5, and may further specify that the island is a metal material.

Example 7 may include the subject matter of any of Examples 1-5, and may further specify that the island is a semiconductor material.

Example 8 may include the subject matter of any of Examples 1-7, and may further include: a third insulating support; and a gate electrode of the SET disposed on a side face of the third insulating support.

Example 9 may include the subject matter of Example 8, and may further specify that a longitudinal axis of the first S/D electrode is parallel to a longitudinal axis of the gate electrode.

Example 10 may include the subject matter of any of Examples 8-9, and may further specify that the side face of the third insulating support faces the side faces of the first and second insulating supports.

Example 11 may include the subject matter of any of Examples 8-10, and may further include a third portion of the dielectric disposed between the island and the gate electrode.

Example 12 may include the subject matter of any of Examples 1-7, and may further specify that the SET is a first SET, the island is a first island, the side face of the first insulating support is a first side face of the first insulating support, the side face of the second insulating support is a first side face of the second insulating support, and the device further includes: third and fourth S/D electrodes of a second SET, wherein the third S/D electrode is disposed on a second side face of the first insulating support and the fourth S/D electrode is disposed on a second side face of the second insulating support; a second island of the second SET, disposed between the third and fourth S/D electrodes and extending into the area between the first and second insulating supports; and third and fourth portions of the dielectric; wherein the third portion of the dielectric is disposed between the third S/D electrode and the second island, and the fourth portion of the dielectric is disposed between the fourth S/D electrode and the second island.

Example 13 may include the subject matter of Example 12, and may further include: a third insulating support; and a gate electrode of the first SET disposed on a side face of the third insulating support, wherein the side face of the third insulating support faces the first side faces of the first and second insulating supports.

Example 14 may include the subject matter of Example 13, and may further specify that the gate electrode is a first gate electrode, the side face of the third insulating support is a first side face, and the device further includes a second gate electrode disposed on a second side face of the third insulating support.

Example 15 may include the subject matter of any of Examples 13-14, and may further include: a fourth insulating support; and a gate electrode of the second SET device disposed on a side face of the fourth insulating support, wherein the side face of the fourth insulating support faces the second side faces of the first and second insulating supports.

Example 16 may include the subject matter of any of Examples 12-15, and may further specify that a third insulating support is disposed between the first and second insulating supports, and the third insulating support is disposed between the first and second islands.

Example 17 may include the subject matter of Example 16, and may further specify that a fifth portion of the dielectric is disposed between the third insulating support and the first island, and a sixth portion of the dielectric is disposed between the third insulating support and the second island.

Example 18 may include the subject matter of any of Examples 16-17, and may further specify that the third insulating support is materially continuous with the first and second insulating supports.

Example 19 may include the subject matter of any of Examples 1-7, and may further specify that the first and second insulating supports are materially contiguous with a third insulating support disposed between the first and second insulating supports.

Example 20 may include the subject matter of any of Examples 1-7, and may further specify that the side face of the first insulating support is a first side face of the first insulating support, and the device further includes a gate electrode disposed on a second side face of the first insulating support.

Example 21 may include the subject matter of Example 20, and may further specify that the gate electrode continuously extends along the second insulating support.

Example 22 is a method of manufacturing a single electron transistor (SET device), including: forming an insulating support; providing a conductive material on at least one side face of the insulating support; after providing the conductive material, providing an insulating material on the conductive material and the insulating support to form a first assembly; forming a recess in the first assembly, wherein the recess extends into the insulating support and separates the conductive material into at least first and second separate conductive portions; providing a dielectric on sidewalls and bottom of the recess; and providing an island material in the recess on the dielectric.

Example 23 may include the subject matter of Example 22, and may further specify that providing the conductive material on the at least one side face of the insulating support includes: providing a metal on top and side faces of the insulating support; and etching the metal from the top face of the insulating support.

Example 24 may include the subject matter of Example 23, and may further specify that providing the conductive material on at least one side face of the insulating support includes removing metal from one side face of the insulating support.

Example 25 may include the subject matter of any of Examples 22-24, and may further specify that providing the conductive material on at least one side face of the insulating support includes performing atomic layer deposition (ALD) of the conductive material on the insulating support.

Example 26 may include the subject matter of any of Examples 22-25, and may further include: after providing the island material, etching back the island material; and after etching back the island material, providing an insulating material in the recess on the island material.

Example 27 may include the subject matter of any of Examples 22-26, and may further specify that the insulating support is a first insulating support, and the method further includes: forming a second insulating support parallel to the first insulating support; and providing a conductive material on at least one side face of the second insulating support.

Example 28 may include the subject matter of Example 27, and may further specify that the first and second insulating supports are formed simultaneously.

Example 29 is a method of operating a single electron transistor (SET), including: controlling a voltage between a drain electrode and a source electrode of the SET; and controlling a voltage between a gate electrode and an island of the SET; wherein the SET includes first and second source/drain (S/D) electrodes, wherein the first S/D electrode is disposed on a side face of a first insulating support and the second S/D electrode is disposed on a side face of a second insulating support, the island, disposed between the first and second S/D electrodes and extending into an area between the first and second insulating supports, and first and second portions of a dielectric, wherein the first portion of the dielectric is disposed between the first S/D electrode and the island, and the second portion of the dielectric is disposed between the second S/D electrode and the island, to provide first and second tunnel junctions (TJs), respectively.

Example 30 may include the subject matter of Example 29, and may further include adjusting the gate voltage of the SET to change a flow rate of single electrons through the SET.

Example 31 may include the subject matter of any of Examples 29-30, and may further include monitoring a conductance of the SET to detect charge in the vicinity of the island.

Example 32 is a computing device, including: a processing device including one or more single electron transistors (SETs), wherein individual ones of the SETs include first and second source/drain (S/D) electrodes, wherein the first S/D electrode is disposed on a side face of a first insulating support and the second S/D electrode is disposed on a side face of a second insulating support, an island, disposed between the first and second S/D electrodes and extending into an area between the first and second insulating supports, and first and second portions of a dielectric, wherein the first portion of the dielectric is disposed between the first S/D electrode and the island, and the second portion of the dielectric is disposed between the second S/D electrode and the island; and a memory device, coupled to the processing device.

Example 33 may include the subject matter of Example 32, and may further include a network communication device, coupled to the memory device.

Example 34 may include the subject matter of any of Examples 32-33, and may further specify that the processing device includes one or more field effect transistors.

Example 35 is a device, including: a substrate; first and second source/drain (S/D) electrodes of a single electron transistor (SET), wherein the first and second S/D electrodes are disposed on the substrate; an island of the SET disposed in an area between the first and second S/D electrodes; first and second portions of dielectric disposed between first S/D electrode and the island and between the second S/D electrode and the island, respectively; and a third portion of dielectric disposed between the substrate and the island.

Example 36 may include the subject matter of Example 35, and may further specify that the island extends outside the area between the first and second S/D electrodes.

Example 37 may include the subject matter of any of Examples 35-36, and may further specify that the island is a metal material.

Example 38 may include the subject matter of any of Examples 35-36, and may further specify that the island is a semiconductor material.

Example 39 may include the subject matter of any of Examples 35-38, and may further specify that a height of the island is less than a height of the first S/D electrode.

Example 40 may include the subject matter of any of Examples 35-39, and may further include an insulating material disposed in the area between the first and second S/D electrodes.

Example 41 may include the subject matter of any of Examples 35-40, and may further include a gate electrode spaced apart from the island.

Example 42 may include the subject matter of Example 41, and may further specify that a longitudinal axis of the gate electrode is parallel to an axis running between the first and second S/D electrodes.

Example 43 may include the subject matter of any of Examples 41-42, and may further include a fourth portion of dielectric disposed between the island and the gate electrode.

Example 44 may include the subject matter of any of Examples 35-43, and may further specify that the first and second portions of the dielectric have a thickness between 0.5 and 5 nanometers.

Example 45 may include the subject matter of any of Examples 35-44, and may further specify that the first and second S/D electrodes are shaped as rectangular solids.

Example 46 is a method of manufacturing a single electron transistor (SET), including: forming a fin of conductive material, wherein the fin extends away from a substrate; after forming the fin, providing an insulating material on the fin to form a first assembly; forming a recess in the first assembly, wherein the recess extends into the fin and separates the fin into at least first and second separate conductive portions; providing a dielectric on sidewalls and bottom of the recess; and providing an island material in the recess on the dielectric.

Example 47 may include the subject matter of Example 46, and may further specify that the recess extends laterally beyond the fin.

Example 48 may include the subject matter of Example 46, and may further specify that the fin is a first fin, and the method further includes forming a second fin of conductive material, wherein the island material is spaced apart from the second fin.

Example 49 may include the subject matter of Example 48, and may further specify that the first and second fins are formed simultaneously.

Example 50 may include the subject matter of any of Examples 46-49, and may further specify that the island material is a semiconductor.

Example 51 may include the subject matter of any of Examples 46-49, and may further specify that the island material is a metal.

Example 52 is a method of operating a single electron transistor (SET), including: controlling a voltage between a drain electrode and a source electrode of the SET; and controlling a voltage between a gate electrode and an island of the SET; wherein the SET includes first and second source/drain (S/D) electrodes, the island of the SET disposed in an area between the first and second S/D electrodes, wherein the island extends outside the area between the first and second S/D electrodes, and first and second portions of dielectric disposed between first S/D electrode and the island and between the second S/D electrode and the island, respectively.

Example 53 may include the subject matter of Example 52, and may further specify that the first and second S/D electrodes are disposed on a substrate, and the SET further includes a third portion of dielectric disposed between the substrate and the island.

Example 54 may include the subject matter of any of Examples 52-53, and may further include adjusting the gate voltage of the SET to change a flow rate of single electrons through the SET.

Example 55 may include the subject matter of any of Examples 52-54, and may further include monitoring a conductance of the SET to detect charge in the vicinity of the island.

Example 56 is a computing device, including: a processing device including one or more single electron transistors (SETs), wherein individual ones of the SETs include: first and second source/drain (S/D) electrodes, an island of the SET disposed in an area between the first and second S/D electrodes, wherein the island extends outside the area between the first and second S/D electrodes, and first and second portions of dielectric disposed between first S/D electrode and the island and between the second S/D electrode and the island, respectively; and a memory device, coupled to the processing device.

Example 57 may include the subject matter of Example 56, and may further include a network communication device, coupled to the memory device.

Example 58 may include the subject matter of any of Examples 56-57, and may further specify that the processing device and the memory device are coupled to a common substrate.

Example 59 may include the subject matter of Example 58, and may further specify that the common substrate is a printed circuit board.

Example 60 may include the subject matter of any of Examples 56-59, and may further specify that the processing device includes one or more field effect transistors.

The invention claimed is:

1. A device, comprising:
   first and second insulating supports;
   first and second source/drain (S/D) electrodes of a single electron transistor (SET), wherein the first S/D electrode is at a side face of the first insulating support and the second S/D electrode is at a side face of the second insulating support;
   an island of the SET, between the first and second S/D electrodes and extending into an area between the first and second insulating supports; and
   first and second portions of a dielectric, wherein the first portion of the dielectric is between the first S/D electrode and the island, and the second portion of the dielectric is between the second S/D electrode and the island, to provide first and second tunnel junctions (TJs), respectively.

2. The device of claim 1, wherein the SET is a first SET, the island is a first island, the side face of the first insulating support is a first side face of the first insulating support, the side face of the second insulating support is a first side face of the second insulating support, and the device further includes:
   third and fourth S/D electrodes of a second SET, wherein the third S/D electrode is at a second side face of the first insulating support and the fourth S/D electrode is at a second side face of the second insulating support;
   a second island of the second SET, between the third and fourth S/D electrodes and extending into the area between the first and second insulating supports; and
   third and fourth portions of the dielectric; wherein the third portion of the dielectric is between the third S/D electrode and the second island, and the fourth portion of the dielectric is between the fourth S/D electrode and the second island.

3. The device of claim 2, further comprising:
   a third insulating support; and
   a gate electrode of the first SET at a side face of the third insulating support, wherein the side face of the third insulating support faces the first side faces of the first and second insulating supports.

4. The device of claim 3, wherein the gate electrode is a first gate electrode, the side face of the third insulating support is a first side face, and the device further includes:
   a second gate electrode at a second side face of the third insulating support.

5. The device of claim 3, further comprising:
   a fourth insulating support; and
   a gate electrode of the second SET device at a side face of the fourth insulating support, wherein the side face of the fourth insulating support faces the second side faces of the first and second insulating supports.

6. The device of claim 2, wherein a third insulating support is between the first and second insulating supports, and the third insulating support is between the first and second islands.

7. The device of claim 6, wherein a fifth portion of the dielectric is between the third insulating support and the first island, and a sixth portion of the dielectric is between the third insulating support and the second island.

8. The device of claim 1, further comprising:
a third insulating support; and
a gate electrode of the SET at a side face of the third insulating support.

9. The device of claim 8, wherein the side face of the third insulating support faces the side faces of the first and second insulating supports.

10. The device of claim 8, further comprising:
a third portion of the dielectric between the island and the gate electrode.

11. The device of claim 1, wherein a height of the island is less than a height of the first S/D electrode.

12. The device of claim 1, wherein the first and second S/D electrodes are on a substrate, and another portion of the dielectric is between the substrate and the island.

13. The device of claim 1, wherein the first and second portions of the dielectric have a thickness between 0.5 and 5 nanometers.

14. The device of claim 1, wherein the first and second S/D electrodes have a thickness, measured from side faces of the first and second insulating supports, respectively, between 1 and 10 nanometers.

15. The device of claim 1, wherein the first and second insulating supports are materially contiguous with a third insulating support between the first and second insulating supports.

16. The device of claim 1, wherein the side face of the first insulating support is a first side face of the first insulating support, and the device further includes:
a gate electrode at a second side face of the first insulating support.

17. A method of manufacturing a single electron transistor (SET device), comprising:
forming an insulating support;
providing a conductive material on at least one side face of the insulating support;
after providing the conductive material, providing an insulating material on the conductive material and the insulating support to form a first assembly;
forming a recess in the first assembly, wherein the recess extends into the insulating support and separates the conductive material into at least first and second separate conductive portions;
providing a dielectric on sidewalls and bottom of the recess; and
providing an island material in the recess on the dielectric.

18. The method of claim 17, wherein the insulating support is a first insulating support, and further comprising:
forming a second insulating support parallel to the first insulating support; and
providing a conductive material on at least one side face of the second insulating support.

19. A computing device, comprising:
a processing device including one or more single electron transistors (SETs), wherein individual ones of the SETs include:
first and second source/drain (S/D) electrodes, wherein the first S/D electrode is at a side face of a first insulating support and the second S/D electrode is at a side face of a second insulating support,
an island, between the first and second S/D electrodes and extending into an area between the first and second insulating supports, and
first and second portions of a dielectric, wherein the first portion of the dielectric is between the first S/D electrode and the island, and the second portion of the dielectric is between the second S/D electrode and the island; and
a memory device, coupled to the processing device.

20. The computing device of claim 19, wherein the processing device includes one or more field effect transistors.

* * * * *